(12) United States Patent
Kim et al.

(10) Patent No.: US 10,985,780 B2
(45) Date of Patent: Apr. 20, 2021

(54) ERROR CORRECTION CIRCUIT, AND MEMORY CONTROLLER HAVING THE ERROR CORRECTION CIRCUIT AND MEMORY SYSTEM HAVING THE MEMORY CONTROLLER

(71) Applicant: SK hynix Inc., Icheon-si (KR)

(72) Inventors: Dae Sung Kim, Icheon-si (KR); Kwang Hyun Kim, Yongin-si (KR)

(73) Assignee: SK hynix Inc., Icheon-si (KR)

( * ) Notice: Subject to any disclaimer, the term of this patent is extended or adjusted under 35 U.S.C. 154(b) by 8 days.

(21) Appl. No.: 16/417,208

(22) Filed: May 20, 2019

(65) Prior Publication Data

US 2020/0119754 A1  Apr. 16, 2020

(30) Foreign Application Priority Data

Oct. 15, 2018  (KR) .......................... 10-2018-0122861

(51) Int. Cl.
*H03M 13/29* (2006.01)
*G06F 11/10* (2006.01)
(Continued)

(52) U.S. Cl.
CPC ..... *H03M 13/2906* (2013.01); *G06F 11/1068* (2013.01); *G11C 29/52* (2013.01); *H03M 13/152* (2013.01); *H03M 13/616* (2013.01)

(58) Field of Classification Search
CPC .................................................. H03M 13/2906
(Continued)

(56) References Cited

U.S. PATENT DOCUMENTS

| 10,707,899 B2 | 7/2020 | Bhatia et al. |
| 2003/0106009 A1 | 6/2003 | Jarchi et al. |

(Continued)

FOREIGN PATENT DOCUMENTS

| KR | 10-1188002 | 10/2012 |
| KR | 10-1394596 | 5/2014 |

(Continued)

OTHER PUBLICATIONS

Non-Final Office Action dated Jan. 25, 2021 for U.S. Appl. No. 16/694,987, filed Nov. 25, 2019 (15 pages).

*Primary Examiner* — Fritz Alphonse
(74) *Attorney, Agent, or Firm* — Perkins Coie LLP

(57) ABSTRACT

Provided herein may be an error correction circuit, and a memory controller and a memory system. The error correction circuit may include an encoder configured to generate a codeword comprising a message part, a first parity part, and a second parity part, and a decoder configured to perform error correction decoding using read values corresponding to at least a portion of the codeword, wherein, the decoder is configured to perform error correction decoding based on a first or a second error correction ability such that error correction decoding using the first error correction ability is performed using partial read values corresponding to a partial codeword including the message part and the first parity part, and error correction decoding using the second error correction ability is performed using read values corresponding to the entire codeword, and wherein the second error correction ability is greater than the first error correction ability.

20 Claims, 17 Drawing Sheets

(51) Int. Cl.
*H03M 13/00* (2006.01)
*H03M 13/15* (2006.01)
*G11C 29/52* (2006.01)

(58) Field of Classification Search
USPC .............................. 714/755, 754, 757, 760
See application file for complete search history.

(56) References Cited

U.S. PATENT DOCUMENTS

| | | | |
|---|---|---|---|
| 2005/0251723 | A1* | 11/2005 | Ilani ................. H04L 1/0083 714/752 |
| 2011/0289380 | A1* | 11/2011 | Wilkerson .......... G06F 11/1064 714/763 |
| 2012/0066563 | A1* | 3/2012 | Obata ................. H03M 13/112 714/752 |
| 2015/0256199 | A1* | 9/2015 | Yen ................. H04L 1/0052 714/752 |
| 2015/0311920 | A1 | 10/2015 | Wang |
| 2016/0179620 | A1 | 6/2016 | Bazarsky et al. |
| 2017/0070239 | A1* | 3/2017 | Hung ................. H03M 13/1185 |
| 2020/0366317 | A1 | 11/2020 | Myung et al. |

FOREIGN PATENT DOCUMENTS

| | | |
|---|---|---|
| KR | 10-2017-0014610 | 2/2017 |
| KR | 10-2018-0027803 | 3/2018 |
| KR | 10-2020-0099438 A | 8/2020 |

\* cited by examiner

FIG. 1A $$[\text{Message}]_k \cdot [\text{Generator matrix}]_{k \times n} = [\underbrace{\text{Codeword}}_{n}]\;\;\overbrace{\text{Message part}}^{k}\;\overbrace{\text{Parity part}}^{n-k}$$

FIG. 1B $$[\text{Parity check matrix}]_{(n-k) \times n} \cdot [\text{Read values}]_n = [\text{Syndrome}]$$

$0^{th}$ error correction ability

1st error correction ability $$\left[ \text{Parity check matrix} \right] {}_{n+\alpha-k} \cdot [R2]_{n+\alpha} = \left[ \begin{array}{c} S \\ y \\ n \\ d \\ r \\ o \\ m \\ e \end{array} \right]$$

$n+\alpha$

2nd error correction ability

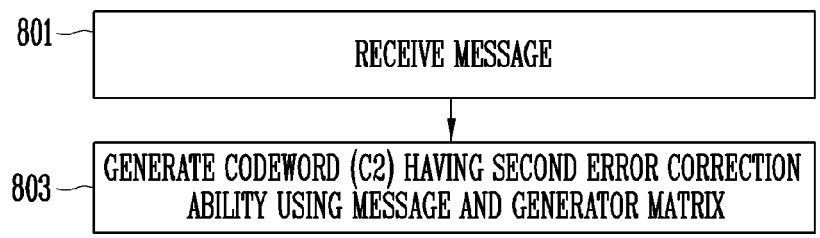
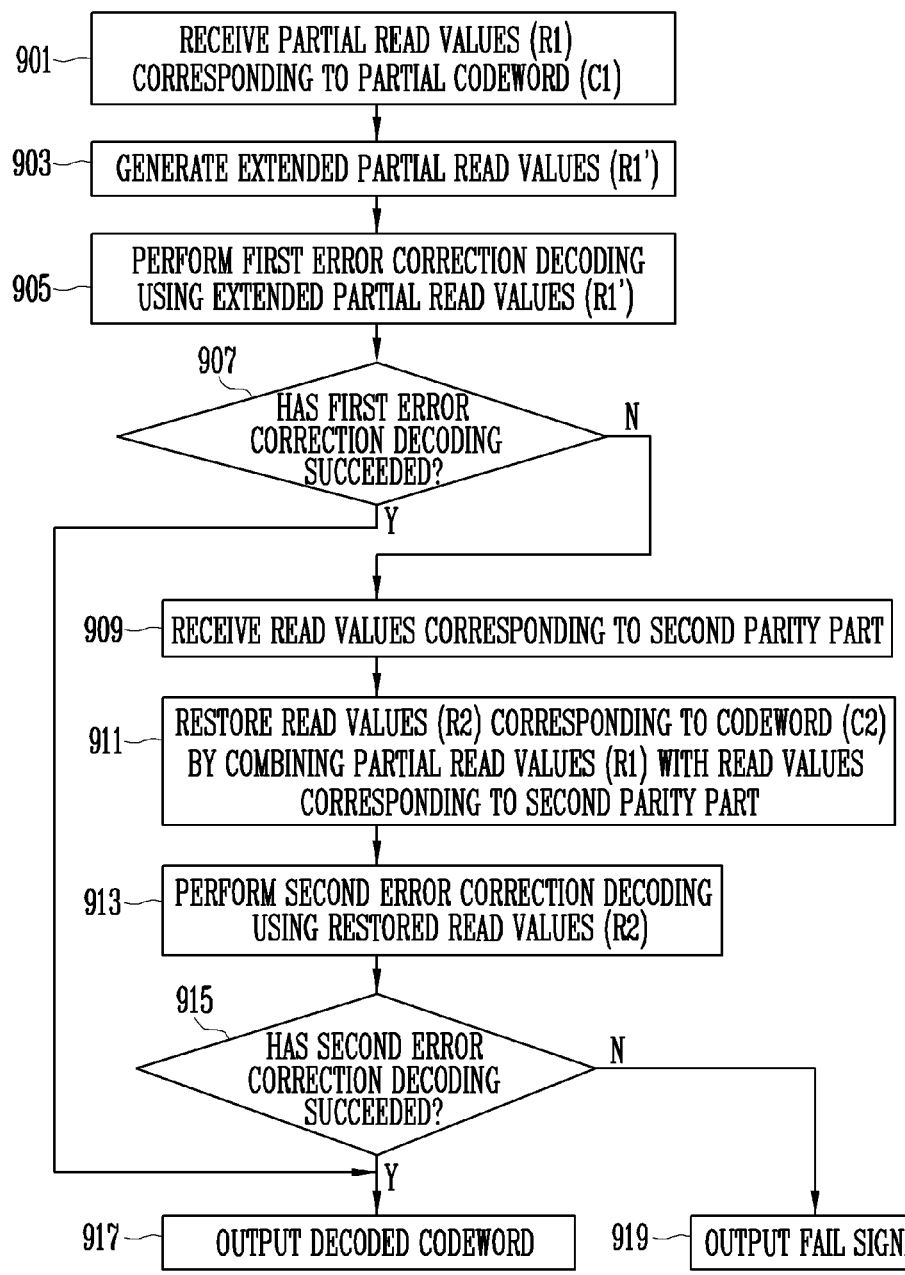

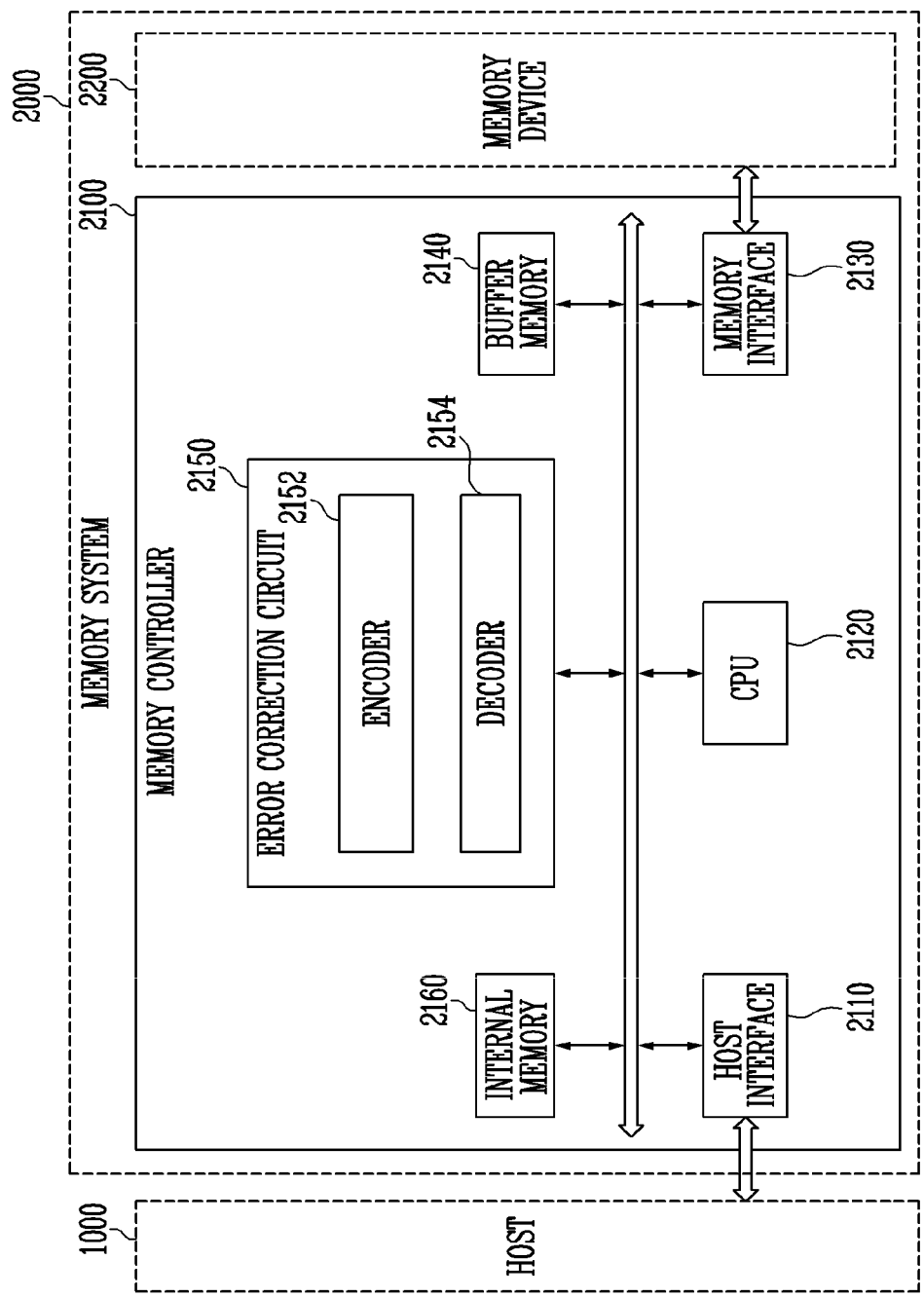

ERROR CORRECTION CIRCUIT, AND MEMORY CONTROLLER HAVING THE ERROR CORRECTION CIRCUIT AND MEMORY SYSTEM HAVING THE MEMORY CONTROLLER

CROSS-REFERENCE TO RELATED APPLICATION

This patent document claims priority to and benefits of the Korean patent application number 10-2018-0122861 filed on Oct. 15, 2018, which is incorporated herein by reference in its entirety.

TECHNICAL FIELD

The technology and implementations disclosed in this patent document generally relate to an error correction circuit, and a memory controller having the error correction circuit and a memory system having the memory controller.

BACKGROUND

A memory system may include a storage media that stores data therein either temporarily or permanently. During various operations of memory system including writing, reading, transmission, or processing of data, unintended changes to the original data such as data error or data corruption can occur as a result of, for example, interferences between adjacent memory cells. Such data error or data corruption should be handled to ensure the reliability of data. Error correction coding is the means whereby errors that may be introduced into data can be corrected based on received data. The memory system may use error correction encoding and decoding techniques to correct errors that may be introduced into data stored in memory cells. The error correction techniques may be implemented in the form of hardware and/or software. For example, circuitry for error correction may perform error correction encoding and decoding in the memory system using an error correction code.

A Bose, Chaudhri, Hocquenghem (BCH) code is a commonly used error correction code in memory systems which allows the memory systems to detect and correct certain number of errors depending on the configuration of the BCH code.

SUMMARY

The technology disclosed in this patent document can be implemented in various embodiments of the disclosed technology to provide an error correction circuit with varying error correction ability, a memory controller having the error correction circuit, and a memory system having the memory controller.

An embodiment of the disclosed technology may provide for an error correction circuit. The error correction circuit may include an encoder configured to generate a codeword comprising a message part, a first parity part, and a second parity part, and a decoder configured to perform error correction decoding using read values corresponding to at least a portion of the codeword, wherein, the decoder is configured to perform error correction decoding based on a first or a second error correction ability such that error correction decoding using the first error correction ability is performed using partial read values corresponding to a partial codeword including the message part and the first parity part, and error correction decoding using the second error correction ability is performed using read values corresponding to the entire codeword, and wherein the second error correction ability is greater than the first error correction ability.

An embodiment of the disclosed technology may provide for a memory controller. The memory controller may include an encoder configured to generate a codeword including a message part, a first parity part, and a second parity part, and a central processing unit (CPU) configured to generate a command and an address and transmit the generated command and address to a memory device so that a partial codeword, consisting of the message part and the first parity part, and the second parity part are stored in different storage areas.

An embodiment of the disclosed technology may provide for a memory system. The memory system may include a memory controller configured to generate a codeword including a message part, a first parity part, and a second parity part, and a memory device configured to receive the codeword from the memory controller, store a partial codeword consisting of the message part and the first parity part of the received codeword in a first storage area and store the second parity part in a second storage area.

An embodiment of the disclosed technology may provide for an error correction circuit. The error correction circuit may include an encoder configured to generate a codeword composed of a message part, a first parity part, and a second parity part, and a decoder configured to perform error correction decoding using read values corresponding to at least a part of the codeword, wherein, when error correction decoding is performed using partial read values corresponding to a partial codeword composed of the message part and the first parity part, the decoder has first error correction ability, and when error correction decoding is performed using read values corresponding to the entire codeword, the decoder has second error correction ability, and wherein the second error correction ability is greater than the first error correction ability.

BRIEF DESCRIPTION OF THE DRAWINGS

FIGS. 1A and 1B are example diagrams for illustrating the error correction ability of a BCH code.

FIG. 8 is a flowchart illustrating how the error correction circuit of FIG. 7 performs error correction encoding.

FIG. 9 is a flowchart illustrating how the error correction circuit of FIG. 7 performs error correction decoding.

FIG. 10 is a diagram illustrating a memory system based on an embodiment of the disclosed technology.

DETAILED DESCRIPTION

Figure 2A:
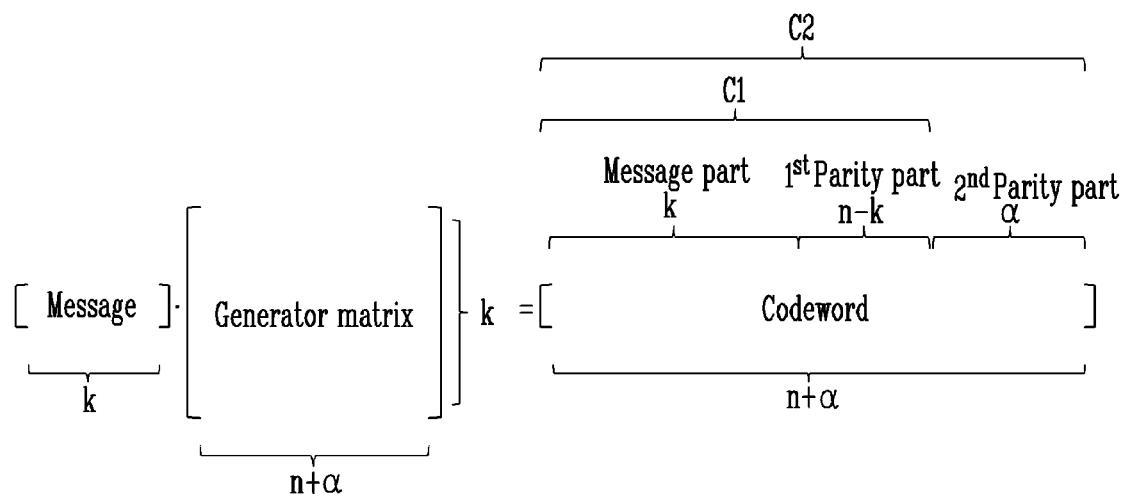
FIGS. 2A, 2B and 2C are example diagrams for illustrating variable error correction ability based on some embodiments of the disclosed technology.

Advantages and features of the disclosed technology, and methods for achieving the same will be cleared with reference to embodiments described later in detail together with the accompanying drawings. The disclosed technology is not limited to the following embodiments but embodied in other forms. Rather, these embodiments are provided so that the disclosed technology will be thorough and complete, and will fully convey the technical spirit of the disclosure to those skilled in the art.

The technology disclosed in this patent document can be implemented in embodiments to provide error correction circuits and methods, that among other features and benefits, provide improved error correction performance by using additional parity bits.

Error correction coding is the means whereby errors that may be introduced into digital data as a result of transmission through a communication channel can be corrected based upon received data. The channel is the medium over which data is conveyed. Examples of channels are telephone lines, cell phone channels, etc. Data storage and memory device such as hard drives and solid memory are other examples of channels.

Error Correction Codes (ECC) are used in NAND Flash memories to detect and correct bit errors. With increased memory complexity, bit error rates continue to grow. With increasing usage of memory devices that store more than one bit per memory cell, this issue has become even more critical. For n-bit multi-level cell NAND flash memory, the threshold voltage of each cell can be programmed to $2^n$ possible values. In an ideal multi-level cell NAND flash memory, each value corresponds to a non-overlapping threshold voltage window. Memory cells programmed to the same value have their threshold voltages fall into the same window, but their exact threshold voltages could be different. As program/erase cycles increase, the margin between neighboring threshold voltage distributions of different programmed states decreases and eventually the distributions start overlapping. As a result, the memory cells with threshold voltages that fall within the overlapping range of the neighboring distributions may be read as being programmed to a value other than the original targeted value and thus cause read errors. Such read errors may be managed in most situations by using the ECC.

FIGS. 1A and 1B are example diagrams for explaining the error correction ability of a Bose, Chaudhri, Hocquenghem (BCH) code.

In using a BCH code, error correction circuits can predefine their error correction ability. For example, the error correction ability of a BCH code may be determined depending on the number of bits of a codeword that is generated by performing error correction encoding using a k-bit message. This may mean that the number of parity bits added to the k-bit message determines the error correction ability of the BCH code.

A codeword is generated by performing error correction encoding. When error correction encoding is performed, a codeword may be generated based on a message and a generator matrix. For example, the product of the message and the generator matrix yields a codeword that includes a message part and a parity part. Here, the size of the generator matrix may be set depending on the level of the error correction ability of the BCH code (or the error correction ability of a BCH decoder) that is to be designated. Provided that a length of a message is constant, when it is desired to increase error correction ability, there is a need to increase the number of columns of the generator matrix, whereas when it is desired to decrease error correction ability, there is a need to decrease the number of columns of the generator matrix. Provided that the length of message is constant, when the number of columns of the generator matrix is increased, code rate is further decreased, whereas when the number of columns of the generator matrix is decreased, code rate is further increased. In FIGS. 1A and 1B, examples of BCH codes that use a generator matrix having a k×n size and a parity check matrix having a (n−k)×n size are illustrated.

As illustrated in FIG. 1A, an error correction circuit may generate an n-bit codeword composed of a k-bit message part and an (n−k)-bit parity part by performing error correction encoding using a k-bit message and a generator matrix having a k×n size.

As illustrated in FIG. 1B, the error correction circuit may perform error correction decoding using n-bit read values corresponding to the n-bit codeword and a parity check matrix having a (n−k)×n size. The product of the n-bit read values and the parity check matrix yields a vector, known as "syndrome vector," which reflects errors of the n-bit read values. When error correction decoding is performed, the error correction circuit may perform a syndrome check operation using the n-bit read values and the parity check matrix having a (n−k)×n size, and may perform error correction based on the result of the syndrome check operation. Here, the error correction circuit may be considered to have a fixed (e.g., $0^{th}$) error correction ability.

Figure 2B:
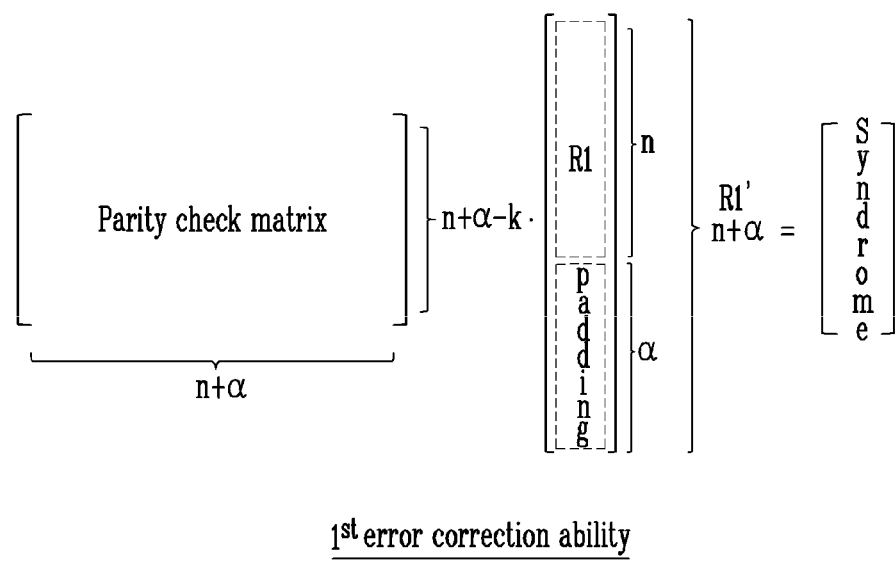
Figures 2C, 3:
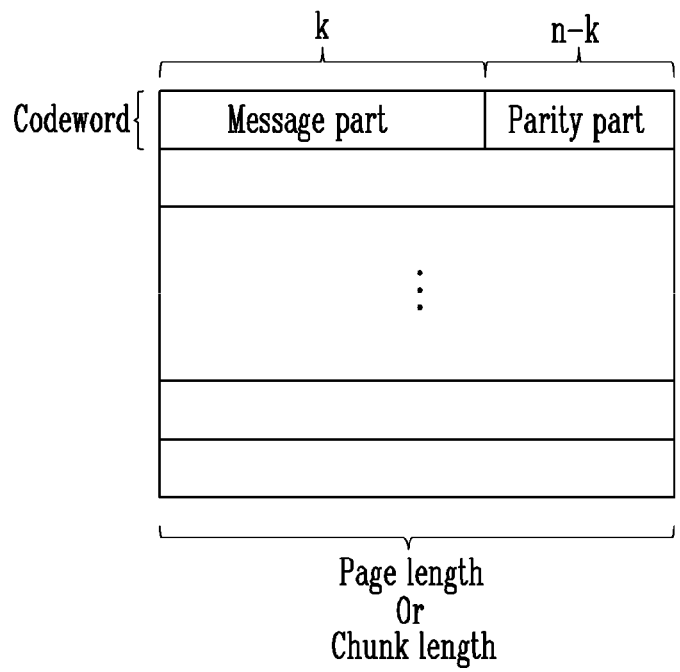
FIG. 3 is an example diagram illustrating how the codeword of a BCH code designed to have a fixed error correction ability is stored.

FIGS. 2A, 2B and 2C are example diagrams for explaining varying error correction ability based on some embodiments of the disclosed technology.

In FIGS. 2A, 2B, and 2C, examples of BCH codes that use a generator matrix having a k×(n+α) size and a parity check matrix having a (n+α−k)×(n+α) size are illustrated.

As illustrated in FIG. 2A, an error correction circuit may generate an (n+α)-bit codeword composed of a k-bit message part and an (n−k+α)-bit parity part by performing error correction encoding using a k-bit message and a generator matrix having a k×(n+α) size. For example, the product of the message and the generator matrix yields a codeword that includes a message part, a first parity part, and a second parity part. Here, the (n−k+α)-bit parity part may be composed of an (n−k)-bit first parity part ($1^{st}$ parity part) and an α-bit second parity part ($2^{nd}$ parity part).

Hereinafter, a codeword composed of the k-bit message part, the (n−k)-bit first parity part, and the α-bit second parity part is referred to as a "codeword C2." Also, the remaining part of the codeword C2 other than the α-bit second parity part is referred to as a "partial codeword C1." That is, the partial codeword C1 may be composed of the k-bit message part and the (n−k)-bit first parity part.

In some embodiments of the disclosed technology, the error correction circuit may perform error correction decoding while varying error correction ability. For example, the error correction ability of the error correction circuit may vary depending on whether error correction decoding is to be performed using partial read values R1 corresponding to the partial codeword C1 or whether error correction decoding is to be performed using read values R2 corresponding to the codeword C2.

When the error correction circuit performs error correction decoding using the partial read values R1 corresponding to the partial codeword C1, the error correction circuit may be considered to have first ($1^{st}$) error correction ability. When the error correction circuit performs error correction decoding using the read values R2 corresponding to the codeword C2, the error correction circuit may be considered to have second ($2^{nd}$) error correction ability. In other words, the partial codeword C1 may have the first error correction ability, and the codeword C2 may have the second error correction ability.

As illustrated in FIG. 2B, when the error correction circuit performs error correction decoding using the first ($1^{st}$) error correction ability, the error correction circuit may perform a syndrome check operation using both n-bit partial read values R1 corresponding to the partial codeword C1 and a parity check matrix of a BCH code designed to have the second ($2^{nd}$) error correction ability, that is, a parity check matrix having a (n+α–k)×(n+α) size, and may perform error correction based on the result of the syndrome check operation. For the syndrome check operation, the error correction circuit may generate extended partial read values R1' having a length of n+α bits by adding ("padding") α symbols to the n-bit partial read values R1 corresponding to the partial codeword C1. This padding scheme can refer to extending a length of read values. The position at which the partial read values R1 are padded with α symbols may be a position corresponding to the second parity part. That is, when the error correction circuit performs error correction decoding using the first error correction ability, an erasure decoding scheme may be used.

As illustrated in FIG. 2C, when the error correction circuit performs error correction decoding using the second ($2^{nd}$) error correction ability, the error correction circuit may perform a syndrome check operation using both (n+α)-bit read values R2 corresponding to the codeword C2 and a parity check matrix of a BCH code designed to have the second ($2^{nd}$) error correction ability, that is, a parity check matrix having a (n+α–k)×(n+α) size, and may perform error correction based on the result of the syndrome check operation.

A relationship between the first error correction ability and the second error correction ability may be defined by the following equation:

$$\text{first error correction ability} = \text{second error correction ability} - \frac{\alpha}{2} \quad \text{Equation (1)}$$

Here, the first error correction ability may be less than the $0^{th}$ error correction ability, described above with reference to FIG. 1.

Varying the error correction ability of the error correction circuit may provide help in minimizing a change in the design of the structure or operation of a system to which the error correction circuit is applied.

For example, when the system with the error correction circuit is designed to process data in units of n bits or is structured to store data in units of n bits, the change of the system may be minimized while system performance is improved, merely by varying the error correction ability of the error correction circuit. This will be described in detail below with reference to FIGS. 3 to 6.

FIG. 3 is an example diagram illustrating how the codeword of a BCH code designed to have a fixed error correction ability is stored.

It is assumed below that an error correction circuit is applied to a memory system. In a memory device included in the memory system, a codeword may be stored on a page basis or a chunk basis in order to meet the design requirements of the memory system. Here, the chunk is part of a single page.

For example, it is assumed that, as illustrated in FIG. 3, a page length or a chunk length is n bits. In this case, a single codeword that has a fixed (e.g., $0^{th}$) error correction ability and includes a k-bit message part and an (n–k)-bit parity part, as described above with reference to FIG. 1A, may be stored in a single page or a single chunk.

Figure 4:
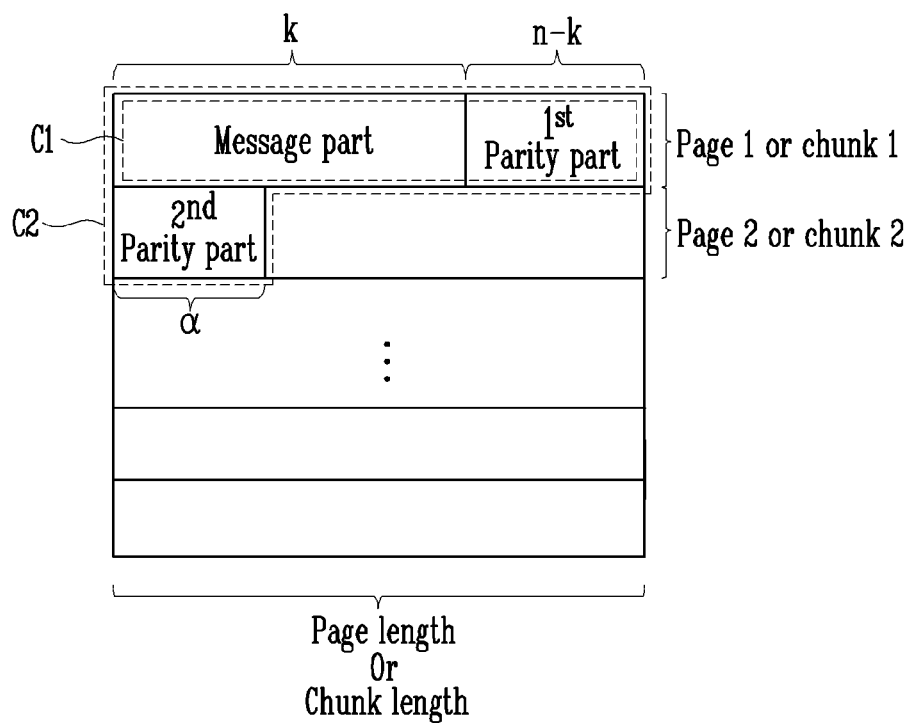
FIGS. 4 to 6 are diagrams illustrating how the codeword of a BCH code designed to have second error correction ability is stored based on some embodiments of the disclosed technology.
Figure 5:
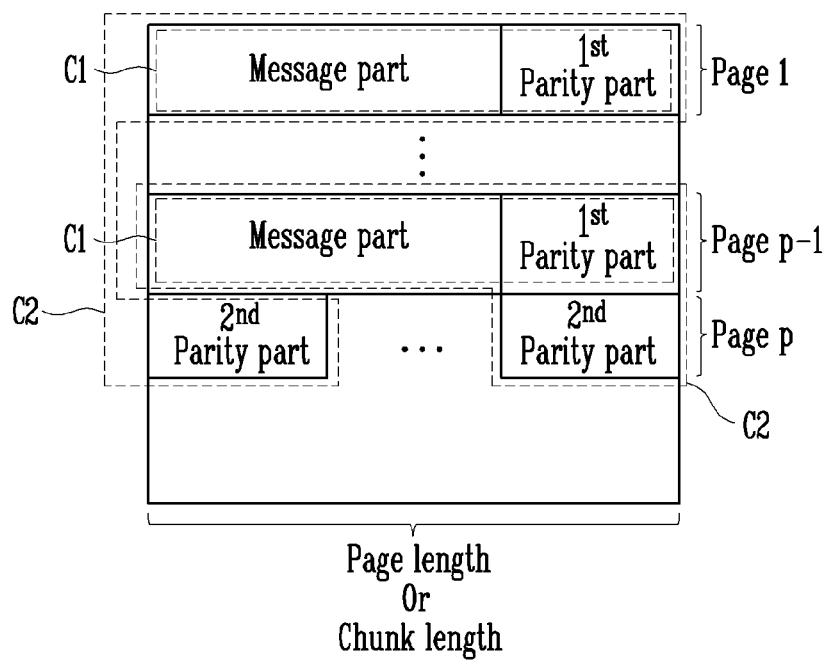
Figure 6:
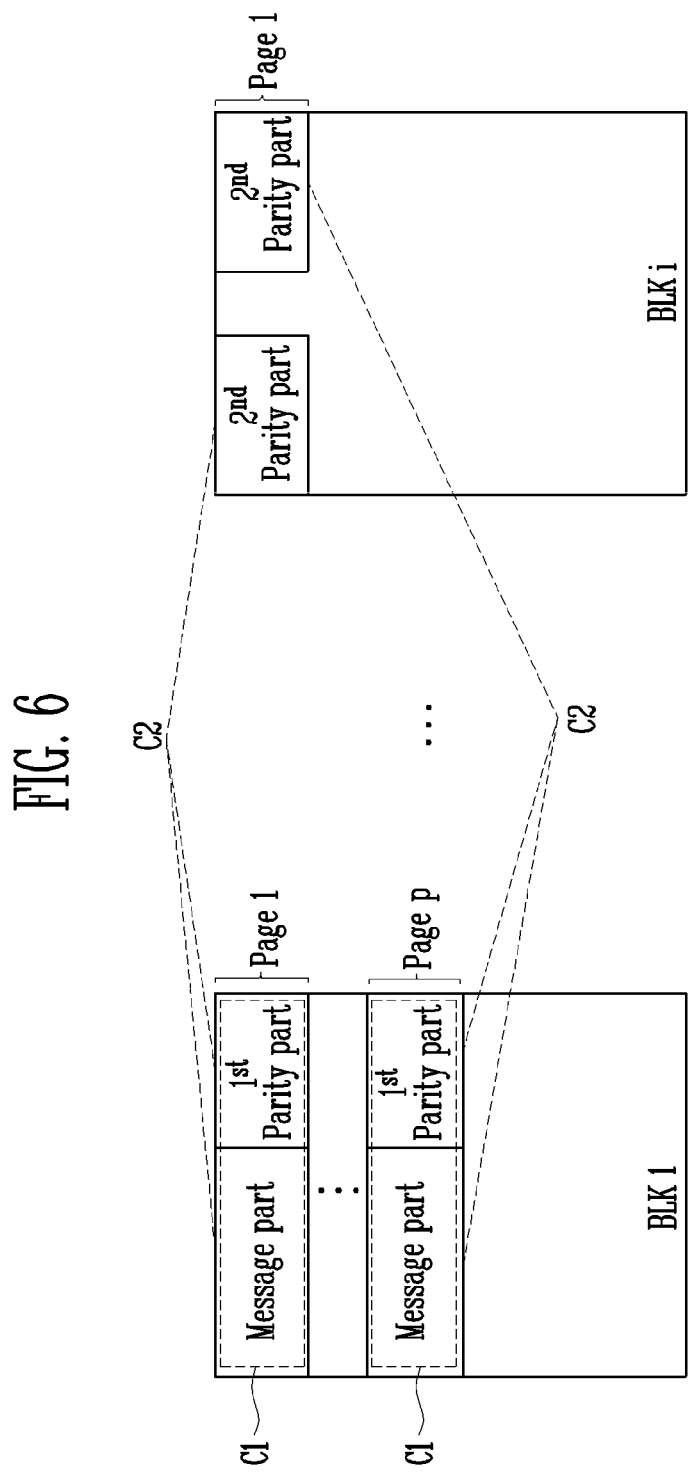

FIGS. 4 to 6 are diagrams illustrating how the codeword of a BCH code designed to have second error correction ability is stored.

In some implementations, a message part and one or more parity parts thereof (e.g., a first parity part and a second parity part) may form a page or chunk if a combined length of the message part, the first parity part and the second parity part does not exceed the length of a single page or a single chunk. In some other implementations, the message part and the first parity part are in one page or chunk and the second parity part may be in another page or chunk in case the combined length of the message part, the first parity part and the second parity part exceed the length of a single page or a single chunk.

It is assumed below that a BCH code designed to have second error correction ability is applied to the memory system described above with reference to FIG. 3, that is, the memory system in which the length of a single page or the length of a single chunk is n bits.

As described above, a codeword C2 having second error correction ability may include a partial codeword C1, composed of a k-bit message part and an (n–k)-bit first parity part ($1^{st}$ parity part), and an α-bit second parity part ($2^{nd}$ parity part). That is, since the length of the codeword C2 is n+α bits, the codeword C2 cannot be stored in a single page or chunk. Therefore, as illustrated in FIG. 4, the n-bit partial codeword C1 may be stored in a first page page1 or a first chunk chunk1, and the α-bit second parity part may be stored in a second page page2 or a second chunk chunk2.

The error correction circuit may perform error correction decoding with first error correction ability by accessing a single page or chunk in which the n-bit partial codeword C1 is stored, or may perform error correction decoding with second error correction ability by additionally accessing a page or a chunk in which the α-bit second parity part is stored.

In case the codeword C2 having the second error correction ability is stored, a partial program scheme may be used.

The partial program scheme is a scheme that is capable of storing data in a part of a single page or in a part of a single chunk. For example, the memory system may divide the page or chunk into a plurality of write units (program units) depending on a preset number of partial programs (NOP). For example, when a page length or chunk length is n bits, the memory system may set the number of partial programs (NOP) to n/α. That is, the memory system may set the length of a program unit to α bits.

When the partial program scheme is used, the memory system may store the entire codeword C2 whenever a single codeword C2 is generated. The partial codeword C1 of the codeword C2 may be stored in a single page or chunk, and the second parity part of the codeword C2 may be stored in a single program unit.

In an embodiment, only second parity parts corresponding to a plurality of codewords C2 may be stored in a single page or chunk. By way of example, FIG. 5 illustrates an example in which partial codewords C1, each composed of a message part and a first parity part ($1^{st}$ parity part), are stored in page 1 to page p-1 and in which second parity parts ($2^{nd}$ parity parts) corresponding to the partial codewords C1 are stored in page p.

In an embodiment, the partial codewords C1 and the second parity parts may be stored in different memory blocks. By way of example, FIG. 6 illustrates an example in which partial codewords C1, each composed of a message part and a first parity part ($1^{st}$ parity part), are stored in page 1 to page p of memory block 1 BLK1 and in which second parity parts ($2^{nd}$ parity parts) corresponding to the partial codewords C1 are stored in page 1 of memory block i BLKi.

In case codewords C2 having second error correction ability are stored, the partial program scheme may not be used. When the partial program scheme is not used, the memory system may store the partial codeword C1 of each codeword C2 in a single page or chunk whenever a single codeword C2 is generated. Also, when second parity parts corresponding to partial codewords C1 are collected to such an extent as to fill the entirety of a single page, the collected second parity parts may be stored in a single page or chunk. In an embodiment, whenever a set number of codewords C2 are generated, the memory system may also store partial codewords C1 and second parity parts.

Figure 7:
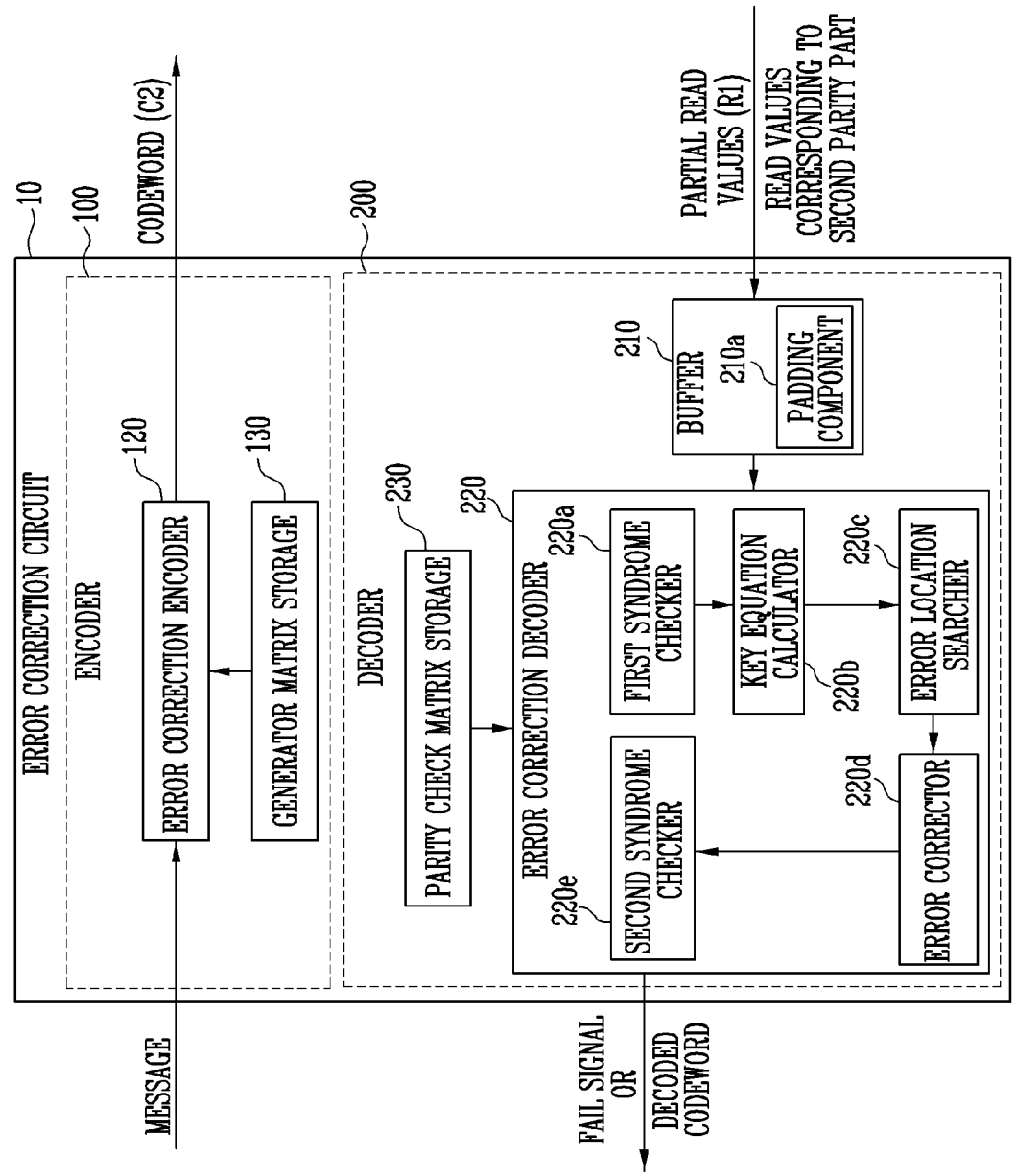
FIG. 7 is a diagram illustrating an example of an error correction circuit based on an embodiment of the disclosed technology.

FIG. 7 is a diagram illustrating an example of an error correction circuit based on an embodiment of the disclosed technology.

Referring to FIG. 7, an error correction circuit 10 implemented based on an embodiment of the disclosed technology may include an encoder 100 and a decoder 200.

The encoder 100 may receive a message and perform error correction encoding on the received message. The encoder 100 may include an error correction encoder 120 and a generator matrix storage 130.

The error correction encoder 120 may receive a k-bit message from an external device such as a host. The error correction encoder 120 may load a generator matrix from the generator matrix storage 130, and may generate a codeword C2 using both the generator matrix and the k-bit message. Here, the generator matrix may have a k×(n+α) size, and the codeword C2 may have second error correction ability. The error correction encoder 120 may output the generated codeword C2 to a channel. The error correction encoder 120 may be a BCH encoder that uses a BCH code as an error correction code. In some implementations, the channel may represent a wired or wireless medium over which information is conveyed or a storage medium in which information is stored. In some implementations of the disclosed technology, the channel may indicate an interface that carries data between the error correction circuit 10 and a memory device, or indicate the memory device itself.

The generator matrix storage 130 may store the generator matrix.

The decoder 200 may receive read values corresponding to at least a part of a codeword C2 from the channel, and may perform error correction decoding on the read values. For example, the decoder 200 may perform error correction decoding using read values R2 corresponding to the codeword C2 having second error correction ability or may perform error correction decoding using partial read values R1 corresponding to a partial codeword C1. When error correction decoding is performed using the partial read values R1, the decoder 200 may be considered to have first error correction ability. When error correction decoding is performed using the read values R2, the decoder 200 may be considered to have second error correction ability. That is, the decoder 200 may perform error correction decoding while varying error correction ability.

The decoder 200 may include a buffer 210, an error correction decoder 220, and a parity check matrix storage 230.

When error correction decoding is performed using the first error correction ability, the buffer 210 may receive partial read values R1 corresponding to a partial codeword C1 composed of a message part and a first parity part from the channel. The buffer 210 may process the partial read values R1 so that the partial read values R1 can be calculated with the parity check matrix of a BCH code designed to have second error correction ability. The parity check matrix of the BCH code designed to have second error correction ability may have a (n+α−k)×(n+α) size. Therefore, the buffer 210 may extend the n-bit length of the partial read values R1 to n+α bits so that it can be calculated with the parity check matrix having a column length of n+α bits. For this operation, the buffer 210 may include a padding component 210a.

When the partial read values R1 having an n-bit length are received, the padding component 210a may generate extended partial read values R1' by extending the length of the partial read values R1. For example, the padding component 210a may generate extended partial read values R1' having a length of n+α bits by padding the partial read values R1 having an n-bit length with α symbols. Here, the padded symbols may have a value of "0" or "1."

The buffer 210 may provide the extended partial read values R1' to the error correction decoder 220.

When error correction decoding is performed using second error correction ability, the buffer 210 may further receive read values corresponding to a second parity part from the channel. Upon receipt of the read values corresponding to the second parity part, the buffer 210 may store the partial read values R1 or the extended partial read values R1'. Therefore, the buffer 210 may restore the read values R2 corresponding to the codeword C2 by combining read values corresponding to the second parity part with the partial read values R1 or by eliminating the padding part of the extended partial read values R1' and then combining the read values corresponding to the second parity part with the partial read values R1.

The buffer 210 may provide the restored read values R2 to the error correction decoder 220.

The error correction decoder 220 may perform error correction decoding using the extended partial read values R1' or the read values R2, received from the buffer 210. The error correction decoder 220 may be a BCH decoder that uses a BCH code as an error correction code.

The error correction decoder 220 may include a first syndrome checker 220a, a key equation calculator 220b, an error location searcher 220c, an error corrector 220d, and a second syndrome checker 220e.

The first syndrome checker 220a may perform a first syndrome check using both the parity check matrix of a BCH code designed to have second error correction ability and the read values (extended partial read values R1' or read values R2) received from the buffer 210. Upon generation of a syndrome vector that has been obtained by product of the parity check matrix and the read value, it can be determined whether the syndrome vector has passed a syndrome check. For example, in a case where all entries of the syndrome vector are zero (0), it can be determined the syndrome vector has passed a syndrome check and the read value has been successfully decoded. In another case where at least one of the entries of the syndrome vector is non-zero, or matches a certain syndrome pattern that is known to have errors, it can be determined the syndrome vector fails to pass the syndrome check and the read value has errors. The first syndrome checker 220a may output a decoded codeword when a syndrome vector has passed a first syndrome check. For example, the first syndrome checker 220a may determine that a syndrome vector has passed the first syndrome check when all entries of a first syndrome vector generated for the first syndrome check are "0," and may determine that the syndrome vector has failed to pass the first syndrome check when at least one of the entries of the first syndrome vector is not "0."

In an embodiment, when the first syndrome check on the extended partial read values R1' indicates the read values have no errors (syndrome check "pass"), the first syndrome checker 220a may extract a portion corresponding to a message part from the extended partial read values R1' and output the extracted portion as a decoded codeword, or may extract a portion corresponding to the message part and the first parity part from the extended partial read values R1' and output the extracted portion as a decoded codeword.

In an embodiment, when the first syndrome check on the read values R2 indicates the read values have no errors (syndrome check "pass"), the first syndrome checker 220a may output the read values R2 as a decoded codeword, or may extract only a portion corresponding to the message part from the read values R2 and may output the extracted portion as a decoded codeword.

When the first syndrome check indicates the read values have some errors (syndrome check "fail"), the first syndrome checker 220a may provide a first syndrome vector to the key equation calculator 220b.

There are many algorithms which have been developed for decoding BCH codes. A decoding method of BCH codes may include (1) computation of the syndrome vector, (2) determination of an error location polynomial, whose roots provide an indication of where the errors are, (3) finding the roots of the error location polynomial, and (4) determination of error values. There are several different ways of finding the location polynomial. These methods include Peterson's algorithm for BCH codes, the Berlekamp-Massey algorithm for BCH codes; the Peterson-Gorenstein-Zierler algorithm for RS codes, the Berlekamp-Massey algorithm for RS codes, and the Euclidean algorithm.

The key equation calculator 220b may generate an error location polynomial based on the first syndrome vector received from the first syndrome checker 220a. When the error location polynomial is generated, a Berlekamp-Massey (BM) algorithm, a Euclidian algorithm or others may be used. The key equation calculator 220b may provide the generated error location polynomial to the error location searcher 220c.

The error location searcher 220c may calculate the location of an error based on the error location polynomial received from the key equation calculator 220b. When the error location is calculated, a Chien search algorithm may be used. The error location searcher 220c may provide the calculated error location to the error corrector 220d.

The error corrector 220d may perform error correction based on information about the error location received from the error location searcher 220c. For example, when a binary BCH code is used, the error corrector 220d may invert an error bit based on the received information about the error location. For example, when a non-binary BCH code is used, error correction may be performed based on a Forney algorithm.

The error corrector 220d may provide the second syndrome checker 222e with the extended partial read values R1" on which error correction has been performed, or the read values R2" on which error correction has been performed.

The second syndrome checker 220e may perform a second syndrome check using both the parity check matrix of the BCH code designed to have second error correction ability and the read values (e.g., the extended partial read values R1" on which error correction has been performed or the read values R2" on which error correction has been performed) received from the error corrector 220d. The second syndrome checker 220e may output a decoded codeword when the second syndrome check indicates the read values have no errors (syndrome check "pass"), and may output a "fail" signal when the second syndrome check indicates the read values have one or more errors (syndrome check "fail"). For example, the second syndrome checker 220e may determine that the syndrome vector has passed the second syndrome check when all entries of the second syndrome vector are "0," and may determine that the syndrome vector has failed the second syndrome check when at least one of the entries of the second syndrome vector is not "0."

In an embodiment, when the second syndrome check on the extended partial read values R1" on which error correction has been performed indicates the read values have no errors (syndrome check "pass"), the second syndrome checker 220e may extract a portion corresponding to a message part from the extended partial read values R1", on which error correction has been performed, and output the extracted portion as a decoded codeword, or may extract a portion corresponding to the message part and the first parity part from the extended partial read values R1", on which error correction has been performed, and output the extracted portion as a decoded codeword.

In an embodiment, when the second syndrome check on the read values R2" on which error correction has been performed indicates the read values have no errors (syndrome check "pass"), the second syndrome checker 220e may output the read values R2", on which error correction has been performed, as a decoded codeword, or may extract a portion corresponding to a message part from the read values R2", on which error correction has been performed, and output the extracted portion as a decoded codeword.

In an embodiment, the second syndrome checker 220e may be omitted, and in this case, the operation that was performed by the second syndrome checker 220e may be performed instead by the first syndrome checker 220a.

The parity check matrix storage 230 may store the parity check matrix of the BCH code designed to have second error correction ability. The parity check matrix of the BCH code designed to have second error correction ability may be used for first error correction decoding and second error correction decoding. That is, the parity check matrix used for the first error correction decoding may be identical to the parity check matrix used for the second error correction decoding.

FIG. 8 is a flowchart illustrating how the error correction circuit of FIG. 7 performs error correction encoding.

At step 801, the error correction circuit may externally receive a message that is the target of error correction encoding. The received message may be a k-bit message.

At step 803, the error correction circuit may generate a codeword C2 having second error correction ability using the k-bit message and a generator matrix, and may output the generated codeword C2. Here, the generator matrix may have a k×(n+α) size, and the codeword C2 may have a length of n+α bits.

FIG. 9 is a flowchart illustrating how the error correction circuit of FIG. 7 performs error correction decoding.

In an embodiment, at least one of the steps illustrated in FIG. 9 may be omitted, and the sequence of the steps may be changed.

At step 901, the error correction circuit may receive partial read values R1 corresponding to a partial codeword C1 composed of a message part and a first parity part from a channel.

At step 903, the error correction circuit may generate extended partial read values R1' by extending the length of the partial read values R1. For example, the error correction circuit may generate the extended partial read values R1' having a length of n+α bits by padding the partial read values R1 with α symbols. For example, the error correction circuit may generate the extended partial read values R1' by padding the partial read values R1 with α "1" or α "0."

At step 905, the error correction circuit may perform first error correction decoding based on the extended partial read values R1'. For example, the error correction circuit may perform a first syndrome check using both the extended partial read values R1' and the parity check matrix of the BCH code designed to have second error correction ability, and may perform error location polynomial calculation, error location search, error correction, etc. when the first syndrome check fails. Also, the error correction circuit may perform a second syndrome check using both the extended partial read values R1'', on which error correction has been performed, and the parity check matrix of the BCH code designed to have second error correction ability.

At step 907, the error correction circuit may determine whether the first error correction decoding has succeeded. For example, when all entries of a first syndrome vector generated for the first syndrome check are "0," or when all entries of a second syndrome vector, generated when the second syndrome check is performed, are "0," it may be determined that the first error correction decoding has succeeded. For example, when an entry other than "0" is present among the entries of the second syndrome vector generated for the second syndrome check, it may be determined that the first error correction decoding has failed.

When it is determined at step 907 that the first error correction decoding has succeeded (in case of Y), the process proceeds to step 917 where a decoded codeword may be output.

When it is determined at step 907 that the first error correction decoding has failed (in case of N), the process may proceed to step 909. At step 909, the error correction circuit may receive read values corresponding to a second parity part from the channel.

At step 911, the error correction circuit may restore the read values R2 corresponding to the codeword C2 by combining the partial read values R1 with read values corresponding to the second parity part.

At step 913, the error correction circuit may perform second error correction decoding based on the restored read values R2. For example, the error correction circuit may perform the first syndrome check using both the read values R2 and the parity check matrix of the BCH code designed to have second error correction ability, and may perform error location polynomial calculation, error location search, error correction, etc. when the first syndrome check fails. Also, the error correction circuit may perform the second syndrome check using both the read values R2'', on which error correction has been performed, and the parity check matrix of the BCH code designed to have second error correction ability.

At step 915, the error correction circuit may determine whether the second error correction decoding has succeeded. For example, when all entries of the first syndrome vector generated for the first syndrome check are "0," or when all entries of the second syndrome vector generated for the second syndrome check are "0," the error correction circuit may determine that the second error correction decoding has succeeded. For example, when an entry other than "0" is present among the entries of the second syndrome vector generated for the second syndrome check, the error correction circuit may determine that the second error correction decoding has failed.

When it is determined at step 915 that the second error correction decoding has succeeded (in case of Y), the process proceeds to step 917 where a decoded codeword may be output.

When it is determined at step 915 that the second error correction decoding has failed (in case of N), the process proceeds to step 919 where a "fail" signal indicating that error correction decoding has failed may be output.

FIG. 10 is a diagram illustrating a memory system based on an embodiment of the disclosed technology.

Referring to FIG. 10, a memory system 2000 may include a memory device 2200 which stores data, and a memory controller 2100 which controls the memory device 2200 under the control of a host 1000.

The host 1000 is capable of communicating with the memory system 2000 using an interface protocol, such as Peripheral Component Interconnect-Express (PCI-E), Advanced Technology Attachment (ATA), Serial ATA (SATA), Parallel ATA (PATA) or Serial Attached SCSI (SAS). Interface protocols used between the host 1000 and the memory system 2000 are not limited to the above-described examples, and an interface protocol, such as a Universal Serial Bus (USB), Multi-Media Card (MMC), Enhanced Small Disk Interface (ESDI), or Integrated Drive Electronics (IDE) interface protocol, may be used.

The memory controller 2100 may control the overall operation of the memory system 2000, and may control data exchange between the host 1000 and the memory device 2200.

The memory controller 2100 may include a host interface 2110, a central processing unit (CPU) 2120, a memory interface 2130, a buffer memory 2140, an error correction circuit 2150, and an internal memory 2160. The host interface 2110, the memory interface 2130, the buffer memory 2140, the error correction circuit 2150, and the internal memory 2160 may be controlled by the CPU 2120.

The host interface 2110 may perform data exchange with the host 1000 using the interface protocol.

The CPU 2120 may perform various types of calculations (operations) or generate commands and addresses so as to control the memory device 2200. For example, the CPU 2120 may generate various commands required for a program operation, a read operation, an erase operation, a data compression operation, and copy-back operations.

The CPU 2120 may control the error correction circuit 2150 so that, when a request to program a message is received from the host 1000, the message is error correction-encoded. The CPU 2120 may set a physical address for storing a codeword C2 having second error correction ability, and may generate a command and an address and output the generated command and address to the memory device 2200 so that the codeword C2 can be stored at the set physical address.

When a partial program scheme is used, the CPU 2120 may generate a command and an address for storing each codeword C2 and output the generated command and address to the memory device 2200 whenever a single codeword C2 is generated. Here, the CPU 2120 may control the buffer memory 2140 so that a single codeword C2 stored in the buffer memory 2140 can be output to the memory device 2200.

In an embodiment in which a partial program scheme is not used, the CPU 2120 may generate commands and addresses for storing a set number of codewords C2 and output the generated commands and addresses to the memory device 2200 whenever a set number of codewords C2 are generated. Here, the CPU 2120 may control the buffer memory 2140 so that the set number of codewords C2 stored in the buffer memory 2140 can be output to the memory device 2200.

In an embodiment in which a partial program scheme is not used, the CPU 2120 may generate a command and an address for storing the partial codeword C1 of each codeword C2 and output the generated command and address to the memory device 2200 whenever a single codeword C2 is generated. Here, the CPU 2120 may control the buffer memory 2140 so that the partial codeword C1 of the codeword C2 stored in the buffer memory 2140 can be output to the memory device 2200. Further, when second parity parts corresponding to partial codewords C1 are collected in the buffer memory 2140 to such an extent as to fill the entirety of a single storage area (e.g., a chunk, a page or a memory block), the CPU 2120 may generate commands and addresses for storing the collected second parity parts and output the generated commands and addresses to the memory device 2200. Here, the CPU 2120 may control the buffer memory 2140 so that the second parity parts collected in the buffer memory 2140 can be output to the memory device 2200.

The CPU 2120 may set physical addresses so that the partial codeword C1 and the second parity part, which are parts of each codeword C2, are stored in different storage areas. For example, the CPU 2120 may determine to store the partial codeword C1 in a first page of a first memory block, and may determine to store the second parity part in a second page of the first memory block. In an embodiment, the CPU 2120 may set physical addresses so that the partial codeword C1 and the second parity part are stored in different memory blocks.

The CPU 2120 may manage a logical to physical (L2P) table in which a physical address at which a partial codeword C1 is stored and a logical address received from the host 1000 are mapped to each other. The CPU 2120 may update the L2P table based on the physical address at which the partial codeword C1 is stored. In some embodiments of the disclosed technology where the CPU 2120 uses a solid-state drive (SSD) as its storage device, the physical address refers to a physical location of data stored in the SSD, and the logical address can refer to a virtual space that is allocated within the SSD. Provided that the SSD includes memory cells that are used as single level cells (SLC), one physical page may be mapped to one logical page. If the SSD includes memory cells that can store more than one data bits per memory cell (e.g., MLC, TLC, etc.), two or more logical pages are mapped to one physical page.

Further, the CPU 2120 may manage a codeword table in which the physical address at which the partial codeword C1 is stored and a physical address at which the second parity part corresponding to the partial codeword C1 is stored are mapped to each other. The CPU 2120 may update the codeword table based on the physical address at which the second parity part corresponding to the partial codeword C1 is stored.

When a request to read a message corresponding to a predetermined logical address is received from the host 1000, the CPU 2120 may check a physical address at which a partial codeword C1 corresponding to the message that is requested to be read is stored, with reference to the L2P table, may generate a command and an address for reading the partial codeword C1 from the checked physical address, and may output the generated command and address to the memory device 2200.

When the error correction circuit 2150 notifies the CPU 2120 that error correction decoding using extended partial read values R1' has failed, the CPU 2120 may generate a command and an address for reading a second parity part corresponding to the partial codeword C1 and output the generated command and address to the memory device 2200. For this operation, the CPU 2120 may check a physical address at which the second parity part corresponding to the partial codeword C1 is stored, with reference to the codeword table. In some implementations, such error correction decoding failure may indicate that the error pattern is an uncorrectable error pattern. In some other implementations, another error correction decoding may be performed even after such error correction decoding failure.

When the error correction circuit 2150 has succeeded in error correction decoding, the CPU 2120 may control the buffer memory 2140 so that a decoded codeword can be transmitted to the host 1000.

The memory interface 2130 may communicate with the memory device 2200 using a communication protocol.

The buffer memory 2140 may temporarily store data while the memory controller 2100 controls the memory device 2200. For example, until a program operation is completed, data received from the host may be temporarily stored in the buffer memory 2140. Further, during a read operation, data read from the memory device 2200 may also be temporarily stored in the buffer memory 2140.

Further, the buffer memory 2140 may receive codewords C2 from the error correction circuit 2150, and may store the codewords C2 or second parity parts until the codewords C2 or the second parity parts are transmitted to the memory device 2200. The buffer memory 2140 may receive the decoded codewords from the error correction circuit 2150, and may store the decoded codewords until the decoded codewords are transmitted to the host 1000.

The error correction circuit 2150 may perform error correction encoding during a program operation, and may perform error correction decoding during a read operation. The error correction circuit 2150 may be an error correction circuit using a BCH code. The error correction circuit 2150 may include an encoder 2152 and a decoder 2154.

The encoder 2152 may perform error correction encoding on a message received from the host 1000. The encoder 2152 may include an error correction encoder and a generator matrix storage. A basic configuration and operation of the encoder 2152 have been described above with reference to FIG. 7. The encoder 2152 may output each codeword C2 to the buffer memory 2140, and may notify the CPU 2120 that the codeword C2 has been generated.

The decoder 2154 may perform error correction decoding using read values (i.e., partial read values R1 or read values R2) received from the memory device 2200. The decoder 2154 may include a buffer, an error correction decoder, and a parity check matrix storage. A basic configuration and operation of the decoder 2154 have been described above with reference to FIG. 7.

When partial read values R1 corresponding to a partial codeword C1 are received from the memory device 2200, the decoder 2154 may perform first error correction decoding with first error correction ability. For example, the decoder 2154 may generate extended partial read values R1' by extending the partial read values R1, and may perform first error correction decoding using the extended partial read values R1'. When first error correction decoding using the extended partial read values R1' fails, the decoder 2154 may notify the CPU 2120 that the first error correction decoding has failed. Accordingly, the CPU 2120 may generate a command and an address for reading a second parity part corresponding to the partial codeword C1, and may transmit the generated command and address to the memory device 2200.

When read values corresponding to the second parity part are further received from the memory device 2200, the decoder 2154 may perform second error correction decoding with second error correction ability. For example, the decoder 2154 may restore read values R2 corresponding to the codeword C2 by combining the partial read values R1 with read values corresponding to the second parity part. The decoder 2154 may perform second error correction decoding using the restored read values R2. When second error correction decoding using the read values R2 fails, the decoder 2154 may notify the CPU 2120 that the second error correction decoding has failed.

When the first error correction decoding or second error correction decoding succeeds, the decoder 2154 may output the decoded codeword to the buffer memory 2140, and may notify the CPU 2120 that error correction decoding has succeeded.

The internal memory 2160 may be used as a storage which stores various types of information required for the operation of the memory controller 2100. The internal memory 2160 may store a plurality of tables. In an embodiment, the internal memory 2160 may store an L2P table in which logical addresses and physical addresses are mapped to each other. In an embodiment, the internal memory 2160 may store a codeword table.

The memory device 2200 may perform a program operation, a read operation, an erase operation, a data compression operation, and a copy-back operation under the control of the memory controller 2100. The memory device 2200 may be implemented as a volatile memory device in which stored data is lost when the supply of power is interrupted or as a nonvolatile memory device in which stored data is retained even when the supply of power is interrupted.

The memory device 2200 may include a plurality of memory blocks, each having a plurality of pages. Each page may include a plurality of chunks. A single page or a single chunk may be composed of a plurality of program units.

The memory device 2200 may receive commands, addresses, and codewords C2 from the memory controller 2100. The memory device 2200 may store the codewords C2 in response to the commands and the addresses received from the memory controller 2100. For example, the memory device 2200 may store the partial codeword C1 of each codeword C2 and the second parity part of the corresponding codeword C2 in different storage areas. For example, the memory device 2200 may store the partial codeword C1 and the second parity part in different pages, different chunks or different memory blocks.

The memory device 2200 may use a partial program scheme when storing the codeword C2. For example, whenever a single second parity part is received from the memory controller 2100, the memory device 2200 may store the received second parity part in a single program unit. The second parity part may be received together with the partial codeword C1 or received separately from the partial codeword C1.

The memory device 2200 may perform a read operation on the partial codeword C1 or the second parity part in response to the commands and the addresses received from the memory controller 2100. The memory device 2200 may provide read values R1 corresponding to the partial codeword C1 or read values corresponding to the second parity part to the memory controller 2100.

Figure 11:
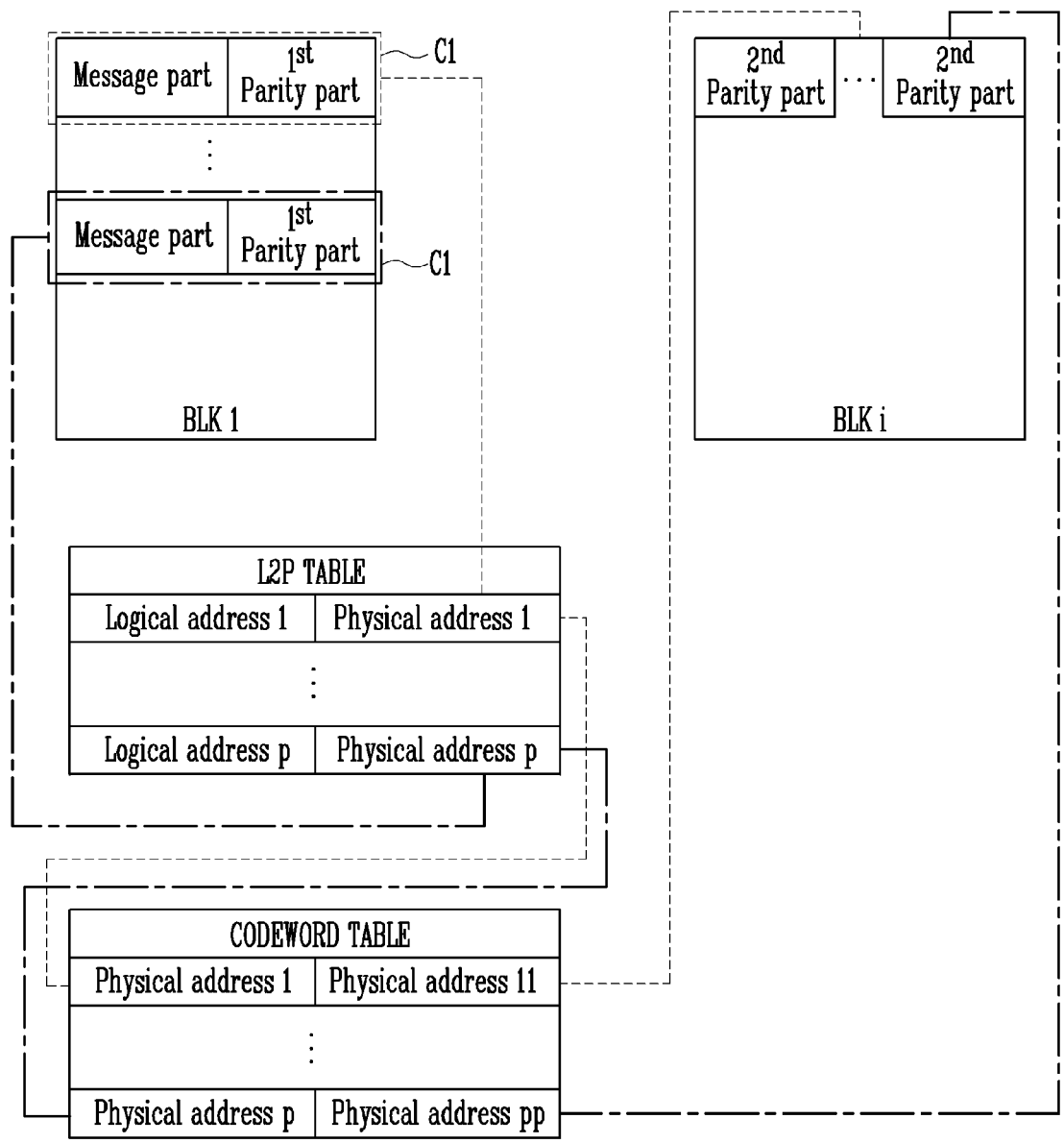
FIG. 11 is an example diagram illustrating a codeword table based on an embodiment of the disclosed technology.

FIG. 11 is an example diagram illustrating a codeword table based on an embodiment of the disclosed technology.

In FIG. 11, an example in which partial codewords C1, each composed of a message part and a first parity part ($1^{st}$ parity part), are stored in physical address 1 to physical address p is illustrated.

In this case, an L2P table may store mapping relationships between logical addresses and physical addresses in accordance with respective partial codewords C1. In the example illustrated in FIG. 11, it can be seen that physical address 1 is mapped to logical address 1, and physical address p is mapped to logical address p.

Further, the codeword table may store mapping relationships between physical addresses (which may be logical addresses in some embodiments) at which partial codewords C1 are stored and physical addresses at which second parity parts are stored. In the example illustrated in FIG. 11, it can be seen that physical addresses (i.e, physical address 1 to physical address p) at which the partial codewords C1 are stored are mapped to physical addresses (i.e., physical address 11 to physical address pp) at which the second parity parts ($2^{nd}$ parity parts) are stored.

Therefore, when first error correction decoding using read values R1 corresponding to a partial codeword C1 fails, a physical address at which a second parity part corresponding to the partial codeword C1 is stored may be derived with reference to the codeword table. Further, the second parity part may be read from a storage area corresponding to the derived physical address.

By way of example and not by limitation, FIG. 11 illustrates that partial codewords C1 and second parity parts ($2^{nd}$ parity parts) corresponding to the partial codewords C1 are stored in different memory blocks BLK1 and BLKi. In some other embodiments of the disclosed technology, the partial codewords C1 and the second parity parts may be stored in the same memory block. For example, the partial codeword C1 is stored in a page of a memory block and the second parity part corresponding to the partial codeword C1 is stored in a different page of the same memory block.

Figure 12:
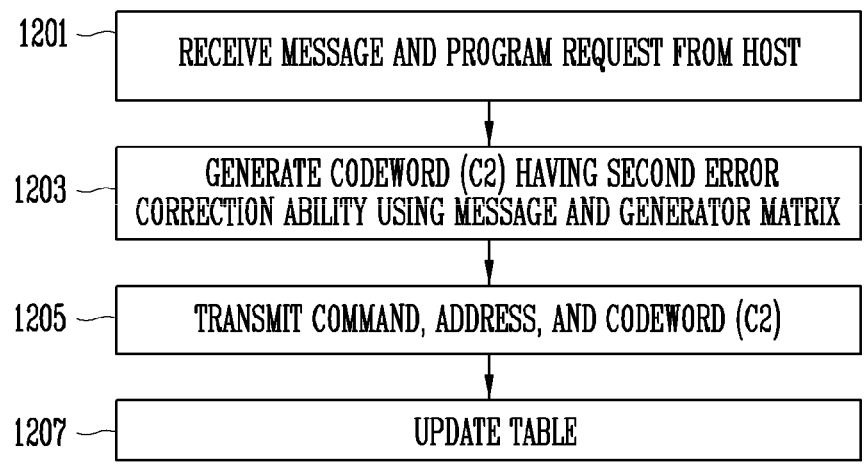
FIG. 12 is a flowchart illustrating how the memory controller of FIG. 10 performs error correction encoding.

FIG. 12 is a flowchart illustrating how the memory controller of FIG. 10 performs error correction encoding.

In an example illustrated in FIG. 12, it is assumed a partial program scheme is used to store second parity parts. In an embodiment, at least one of the steps illustrated in FIG. 12 may be omitted, and the sequence of the steps may be changed.

At step 1201, the memory controller may receive a k-bit message and a program request to program the k-bit message from a host.

At step 1203, the memory controller may generate a codeword C2 having second error correction ability using the k-bit message and a generator matrix. Here, the generator matrix may have a k×(n+α) size, and the codeword C2 may have a length of n+α bits. In detail, the codeword C2 may be composed of the k-bit message part, an (n−k)-bit first parity part, and an α-bit second parity part.

At step 1205, the memory controller may generate a command and an address for storing the codeword C2, and may transmit the generated command and address and the codeword C2 to the memory device. Here, the memory controller may generate the command and the address so that a partial codeword C1, composed of the k-bit message part and the (n−k)-bit first parity part, and the α-bit second parity part corresponding to the partial codeword C1 are stored in different chunks, different pages or different memory blocks.

At step 1207, the memory controller may update at least one of an L2P table and a codeword table.

Figure 13:
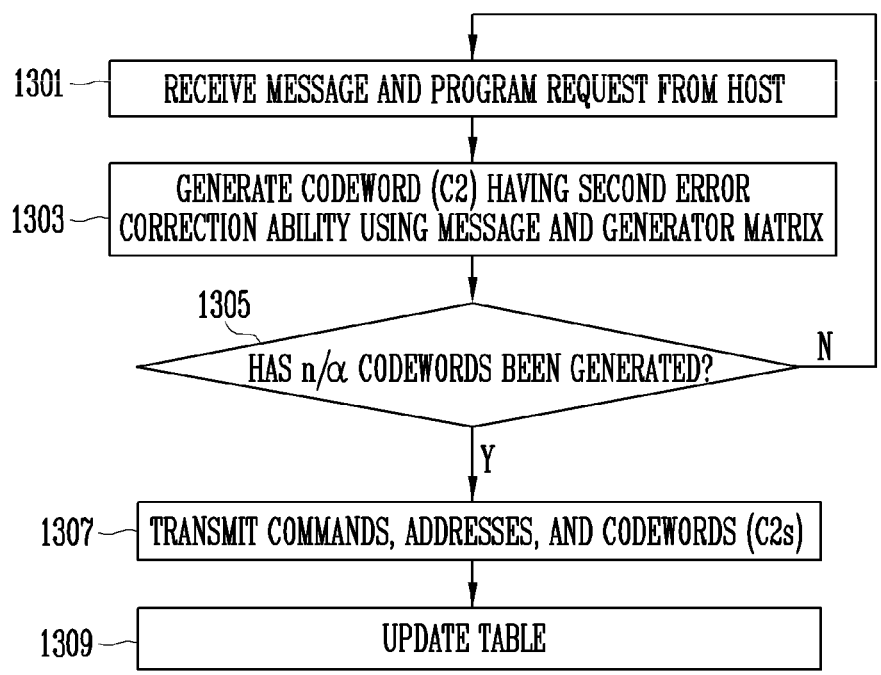
FIG. 13 is a flowchart illustrating how the memory controller of FIG. 10 performs error correction encoding.

FIG. 13 is a flowchart illustrating how the memory controller of FIG. 10 performs error correction encoding.

In an example illustrated in FIG. 13, a case where a partial program scheme is not used to store a second parity part is assumed. In an embodiment of the disclosed technology, at least one of the steps illustrated in FIG. 13 may be omitted, and the sequence of the steps may be changed.

At step 1301, the memory controller may receive a k-bit message and a program request to program the k-bit message from a host.

At step 1303, the memory controller may generate a codeword C2 having second error correction ability using the k-bit message and a generator matrix. Here, the generator matrix may have a k×(n+α) size, and the codeword C2 may have a length of n+α bits. In detail, the codeword C2 may be composed of the k-bit message part, an (n−k)-bit first parity part, and an α-bit second parity part.

At step 1305, the memory controller may determine whether a set number of codewords C2 have been generated. For example, assuming that a single page or chunk has a length of n bits, the memory controller may determine whether n/α codewords C2 have been generated. That is, the memory controller may determine whether a number of second parity parts have been generated to such an extent as to fill the entirety of a single chunk, page or memory block. When it is determined at step 1305 that the set number of codewords C2 have not yet been generated (in case of N), the process may return to step 1301. When it is determined at step 1305 that the set number of codewords C2 have been generated (in case of Y), the process may proceed to step 1307.

At step 1307, the memory controller may generate commands and addresses for storing the codewords C2, and may transmit the generated commands and addresses and the codewords C2 to the memory device. Here, the memory controller may generate the commands and the addresses so that partial codewords C1, each composed of the k-bit message part and the (n−k)-bit first parity part, and the second parity parts corresponding to the partial codewords C1 can be stored in different chunks, different pages or different memory blocks.

At step 1309, the memory controller may update at least one of an L2P table and a codeword table.

Unlike the example illustrated in FIG. 13, in another embodiment of the disclosed technology, the memory controller may generate a command and an address for storing the partial codeword C1 of each codeword C2 and output the generated command and address to the memory device whenever a single codeword C2 is generated. Further, when second parity parts corresponding to partial codewords C1 are collected to such an extent as to fill the entirety of a single chunk, page or memory block, the memory controller may generate commands and addresses for storing the collected second parity parts, and may transmit the generated commands and addresses to the memory device.

Figure 14:
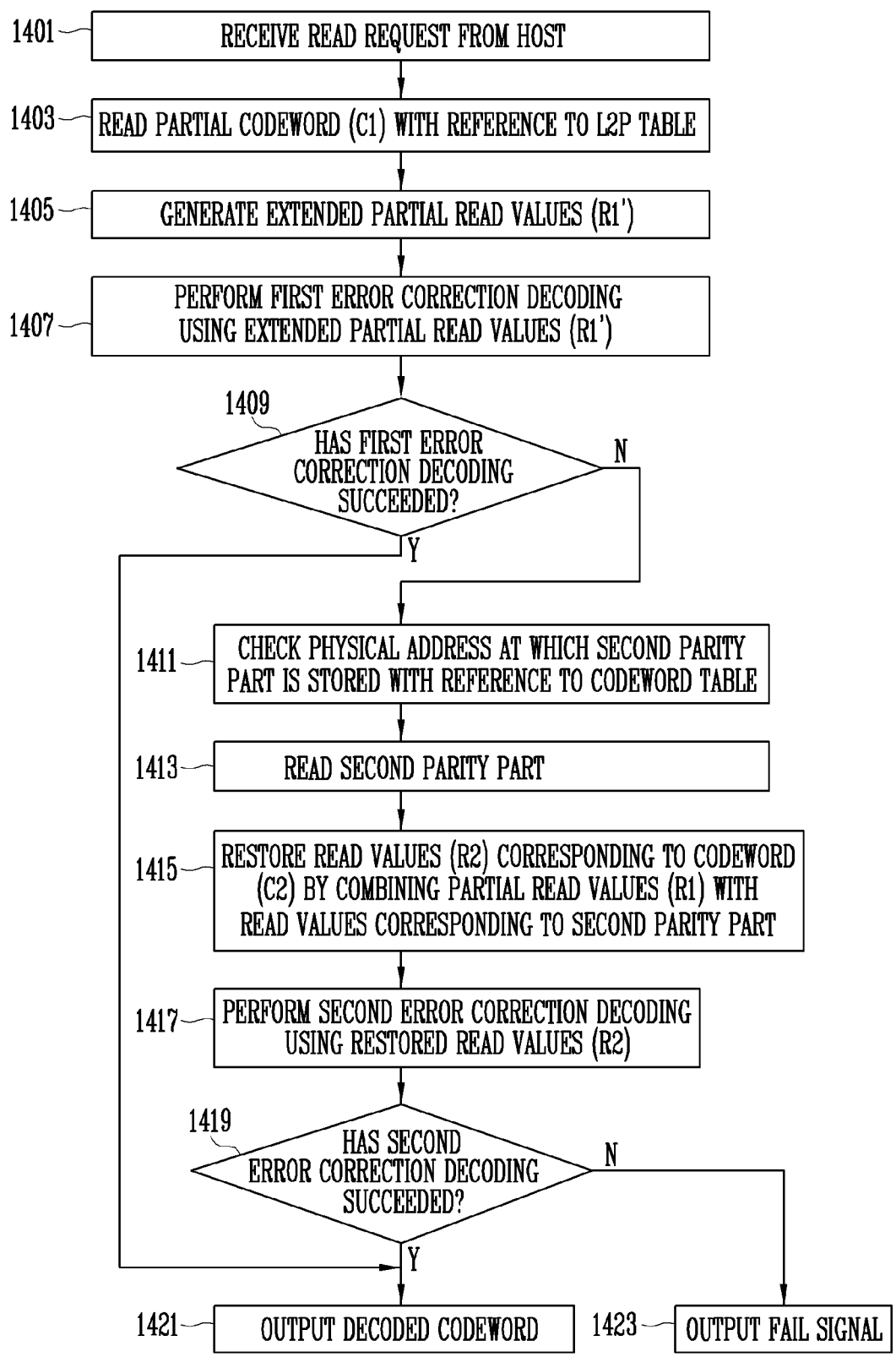
FIG. 14 is a flowchart illustrating how the memory controller of FIG. 10 performs error correction decoding.

FIG. 14 is a flowchart illustrating how the memory controller of FIG. 10 performs error correction decoding.

In an embodiment of the disclosed technology, at least one of the steps illustrated in FIG. 14 may be omitted, and the sequence of the steps may be changed.

At step 1401, the memory controller may receive a read request from a host. The read request may include a logical address.

At step 1403, the memory controller may check a physical address corresponding to the logical address that is requested by the host to be read with reference to an L2P table, and may read a partial codeword C1 stored in a storage area (page or chunk) corresponding to the checked physical address.

At step 1405, the memory controller may generate extended partial read values R1' by extending the length of partial read values R1 corresponding to the partial codeword C1. For example, the memory controller may generate the extended partial read values R1' having a length of n+α bits by padding the partial read values R1 with α symbols. For example, the memory controller may generate the extended partial read values R1' by padding the partial read values R1 with α "1" or α "0."

At step 1407, the memory controller may perform first error correction decoding based on the extended partial read values R1'. For example, the memory controller may perform a first syndrome check using both the extended partial read values R1' and a parity check matrix of a BCH code designed to have second error correction ability, and may perform error location polynomial calculation, error location search, error correction, etc. when the first syndrome check fails. Also, the memory controller may perform a second syndrome check using both extended partial read values R1", on which error correction has been performed, and the parity check matrix of the BCH code designed to have second error correction ability.

At step 1409, the memory controller may determine whether the first error correction decoding has succeeded. For example, when all entries of a first syndrome vector, generated when the first syndrome check is performed, are "0," or when all entries of a second syndrome vector, generated when the second syndrome check is performed, are "0," the memory controller may determine that the first error correction decoding has succeeded. For example, when an entry other than "0" is present among the entries of the second syndrome vector generated when the second syndrome check is performed, the memory controller may determine that the first error correction decoding has failed.

When it is determined at step 1409 that the first error correction decoding has succeeded (in case of Y), the process proceeds to step 1421 where a decoded codeword may be output.

In contrast, when it is determined at step 1409 that the first error correction decoding has failed (in case of N), the process may proceed to step 1411. At step 1411, the memory controller may check a physical address at which the second parity part corresponding to the partial codeword C1 is stored, with reference to a codeword table.

At step 1413, the memory controller may read the second parity part from a storage area corresponding to the checked physical address.

At step 1415, the memory controller may restore read values R2 corresponding to the codeword C2 by combining the partial read values R1 with read values corresponding to the second parity part.

At step 1417, the memory controller may perform second error correction decoding based on the read values R2. For example, the memory controller may perform a first syndrome check using the read values R2 and the parity check matrix of the BCH code designed to have second error correction ability, and may perform error location polynomial calculation, error location search, error correction, etc. when the first syndrome check fails. Also, the memory controller may perform a second syndrome check using both the read values R2", on which error correction has been performed, and the parity check matrix of the BCH code designed to have second error correction ability.

At step 1419, the memory controller may determine whether the second error correction decoding has succeeded. For example, when all entries of a first syndrome vector, generated when the first syndrome check is performed, are "0," or when all entries of a second syndrome vector, generated when the second syndrome check is performed, are "0," the memory controller may determine that the second error correction decoding has succeeded. For example, when an entry other than '0' is present among the entries of the second syndrome vector generated when the second syndrome check is performed, the memory controller may determine that the second error correction decoding has failed.

When it is determined at step 1419 that the second error correction decoding has succeeded (in case of Y), the process proceeds to step 1421 where a decoded codeword may be output.

When it is determined at step 1419 that the second error correction decoding has failed (in case of N), the process proceeds to step 1423 where a "fail" signal indicating that error correction decoding has failed may be output.

Figure 15:
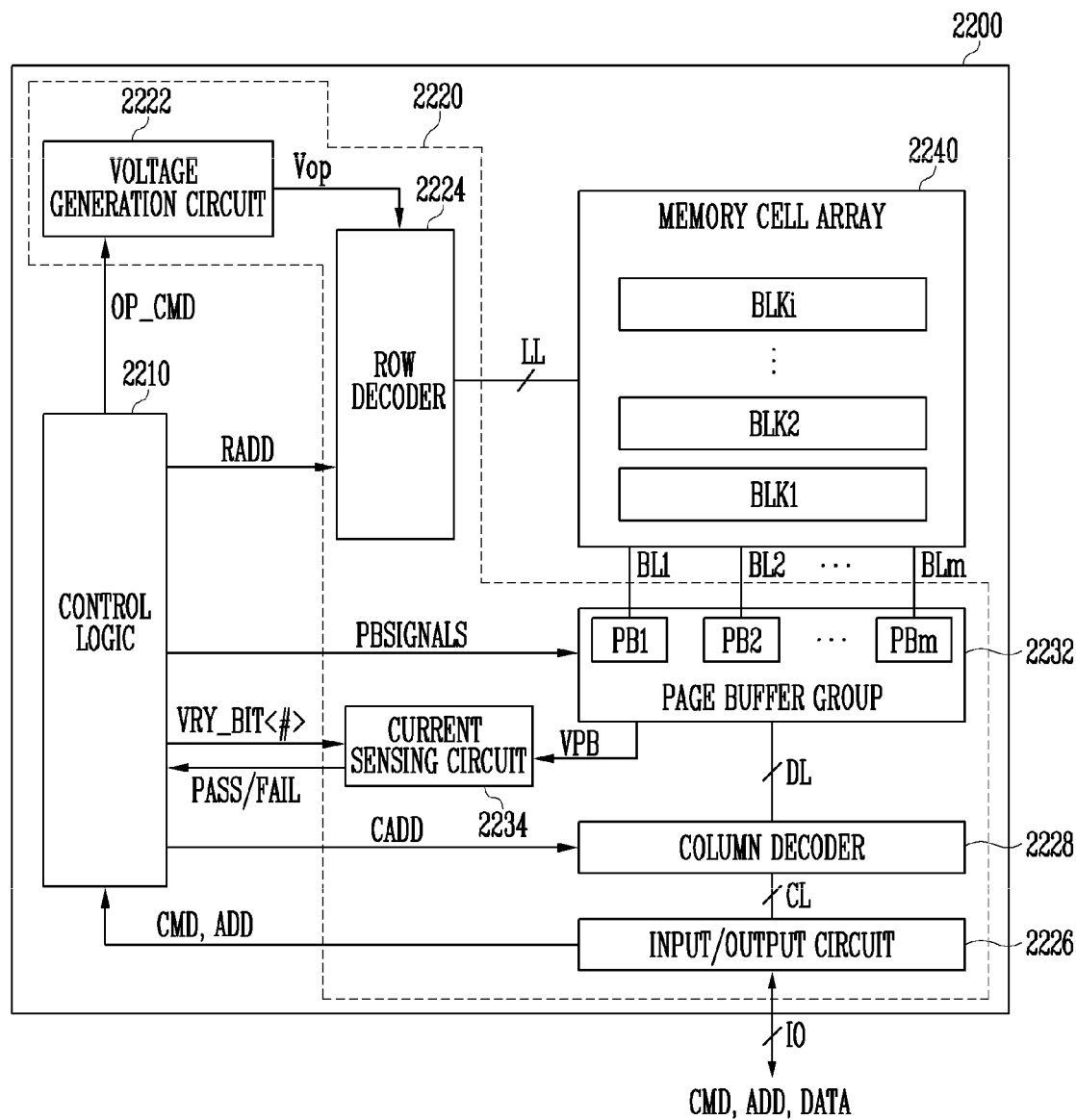
FIG. 15 is a diagram illustrating a memory device based on an embodiment of the disclosed technology.

FIG. 15 is a diagram illustrating a memory device based on an embodiment of the disclosed technology. The memory device illustrated in FIG. 15 may be applied to the memory system illustrated in FIG. 10.

The memory device 2200 may include a control logic 2210, peripheral circuits 2220 and a memory cell array 2240. The peripheral circuits 2220 may include a voltage generation circuit 2222, a row decoder 2224, an input/output circuit 2226, a column decoder 2228, a page buffer group 2232, and a current sensing circuit 2234.

The control logic 2210 may control the peripheral circuits 2220 under the control of the memory controller 2100 of FIG. 10.

The control logic 2210 may control the peripheral circuits 2220 in response to a command CMD and an address ADD that are received from the memory controller 2100 through the input/output circuit 2226. For example, the control logic 2210 may output an operation signal OP_CMD, a row address RADD, a column address CADD, page buffer control signals PB SIGNALS, and an enable bit VRY_BIT<#> in response to the command CMD and the address ADD. The control logic 2210 may determine whether a verify operation has succeeded or failed (whether a threshold voltage of a memory cell has reached a target level or not) in response to a "pass" or "fail" signal PASS or FAIL received from the current sensing circuit 2234.

The peripheral circuits 2220 may perform a program operation of storing data in the memory cell array 2240, a read operation of outputting data stored in the memory cell array 2240, and an erase operation of erasing data stored in the memory cell array 2240.

The voltage generation circuit 2222 may generate various operating voltages Vop that are used for the program, read, and erase operations in response to the operation signal OP_CMD received from the control logic 2210. For example, the voltage generation circuit 2222 may transfer a program voltage, a verify voltage, a pass voltage, a read voltage, an erase voltage, a turn-on voltage, etc. to the row decoder 2224.

The row decoder 2224 may transfer the operating voltages Vop to local lines LL that are coupled to a memory block selected from among memory blocks included in the memory cell array 2240 in response to the row address RADD received from the control logic 2210. The local lines LL may include local word lines, local drain select lines, and local source select lines. In addition, the local lines LL may include various lines, such as source lines, coupled to memory blocks.

The input/output circuit 2226 may transfer the command CMD and the address ADD, received from the memory controller through input/output (IO) lines, to the control logic 2210, or may exchange data with the column decoder 2228.

The column decoder 2228 may transfer data between the input/output circuit 2226 and the page buffer group 2232 in response to a column address CADD received from the control logic 2210. For example, the column decoder 2228 may exchange data with page buffers PB1 to PBm through data lines DL or may exchange data with the input/output circuit 2226 through column lines CL.

The page buffer group 2232 may be coupled to bit lines BL1 to BLm coupled in common to the memory blocks BLK1 to BLKi. The page buffer group 2232 may include a plurality of page buffers PB1 to PBm coupled to the bit lines BL1 to BLm, respectively. For example, one page buffer may be coupled to a corresponding bit line. The page buffers PB1 to PBm may be operated in response to the page buffer control signals PBSIGNALS received from the control logic 2210. For example, during a program operation, the page buffers PB1 to PBm may temporarily store program data received from the memory controller, and may control voltages to be applied to the bit lines BL1 to BLm based on the program data. Also, during a read operation, the page buffers PB1 to PBm may temporarily store data received through the bit lines BL1 to BLm or may sense voltages or currents of the bit lines BL1 to BLm.

During a read operation or a verify operation, the current sensing circuit 2234 may generate a reference current in response to the enable bit VRY_BIT<#> received from the control logic 2210, and may compare a reference voltage, generated by the reference current, with a sensing voltage VPB, received from the page buffer group 2232, and then output a "pass" signal PASS or a "fail" signal FAIL.

The memory cell array 2240 may include a plurality of memory blocks BLK1 to BLKi in which data is stored. In the memory blocks BLK1 to BLKi, user data and various types of information required for the operation of the memory device 2200 may be stored. The memory blocks BLK1 to BLKi may each be implemented as a two-dimensional (2D) structure or a three-dimensional (3D) structure, and may be equally configured.

Figure 16:
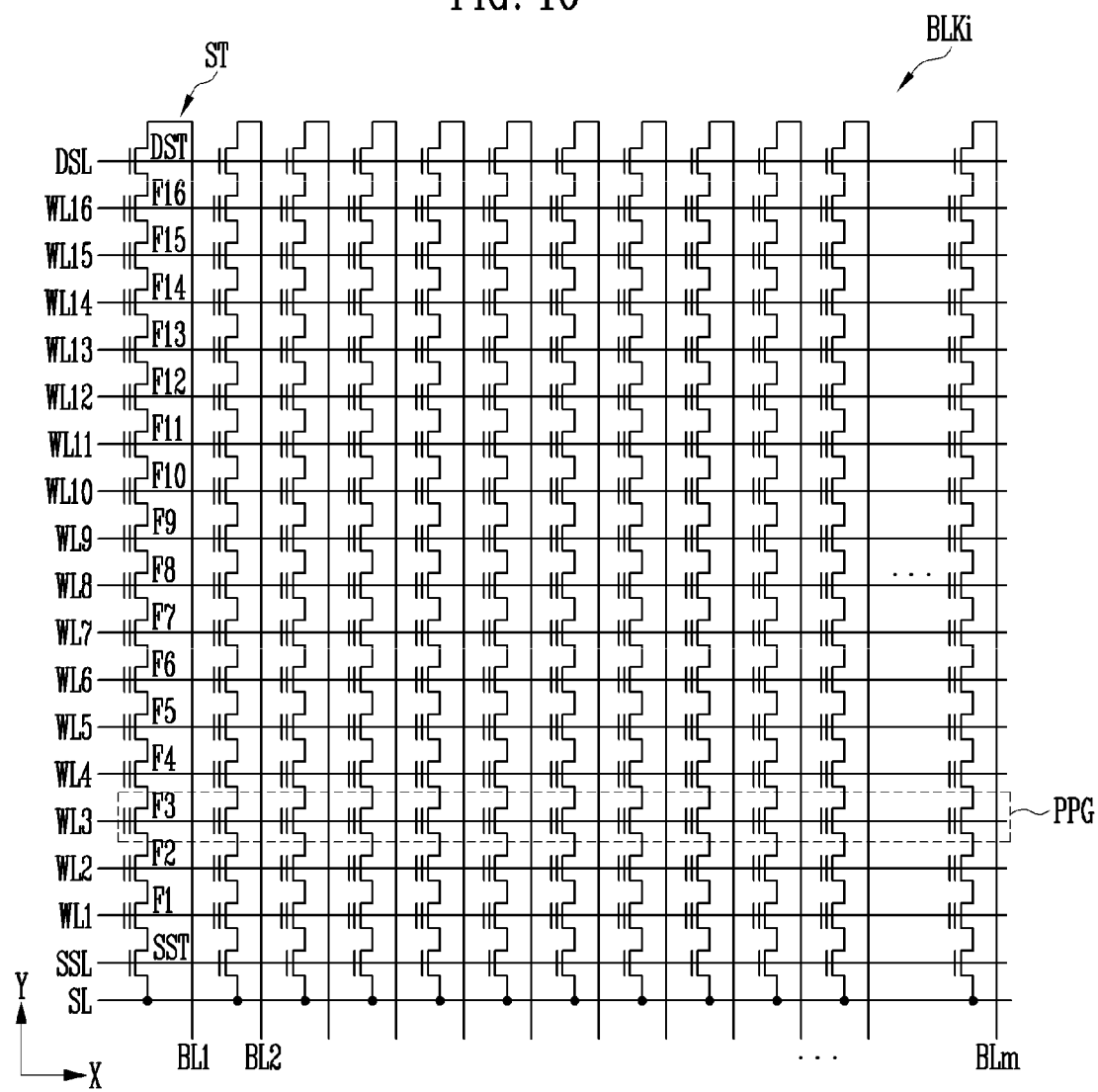
FIG. 16 is an example diagram illustrating a memory block.

FIG. 16 is a diagram illustrating a memory block.

A memory cell array may include a plurality of memory blocks, and any one memory block BLKi of the plurality of memory blocks is illustrated in FIG. 16 for convenience of description.

A plurality of word lines arranged in parallel to each other between a first select line and a second select line may be coupled to the memory block BLKi. Here, the first select line may be a source select line SSL, and the second select line may be a drain select line DSL. In detail, the memory block BLKi may include a plurality of strings ST coupled between bit lines BL1 to BLm and a source line SL. The bit lines BL1 to BLm may be coupled to the strings ST, respectively, and the source line SL may be coupled in common to the strings ST. The strings ST may be equally configured, and thus the string ST coupled to the first bit line BL1 will be described in detail by way of example.

The string ST may include a source select transistor SST, a plurality of memory cells F1 to F16, and a drain select transistor DST which are coupled in series to each other between the source line SL and the first bit line BL1. A single string ST may include at least one source select transistor SST and at least one drain select transistor DST, and more memory cells than the memory cells F1 to F16 illustrated in the drawing may be included in the string ST.

A source of the source select transistor SST may be coupled to the source line SL, and a drain of the drain select transistor DST may be coupled to the first bit line BL1. The memory cells F1 to F16 may be coupled in series between the source select transistor SST and the drain select transistor DST. Gates of the source select transistors SST included in different strings ST may be coupled to the source select line SSL, gates of the drain select transistors DST included in different strings ST may be coupled to the drain select line DSL, and gates of the memory cells F1 to F16 may be coupled to a plurality of word lines WL1 to WL16, respectively. A group of memory cells coupled to the same word line, among the memory cells included in different strings ST, may be referred to as a "physical page (PPG)." Therefore, the memory block BLKi may include a number of physical pages PPG identical to the number of word lines WL1 to WL16.

One memory cell may store one bit of data. This cell is called a single-level cell (SLC). Under the SLC scenario, one physical page PPG may be mapped to one logical page LPG. The data corresponding to one logical page LPG may include a number of data bits identical to the number of cells included in one physical page PPG. For example, when two or more bits of data are stored in one memory cell, one physical page PPG may store data corresponding to two or more logical pages LPG. For example, in a memory device driven in an MLC type, two logical pages are mapped to one physical page, and thus data corresponding to two logical pages may be stored in one physical page PPG. In a memory device driven in a TLC type, three logical pages are mapped to one physical page, and thus data corresponding to three logical pages may be stored in one physical page PPG.

Figure 17:
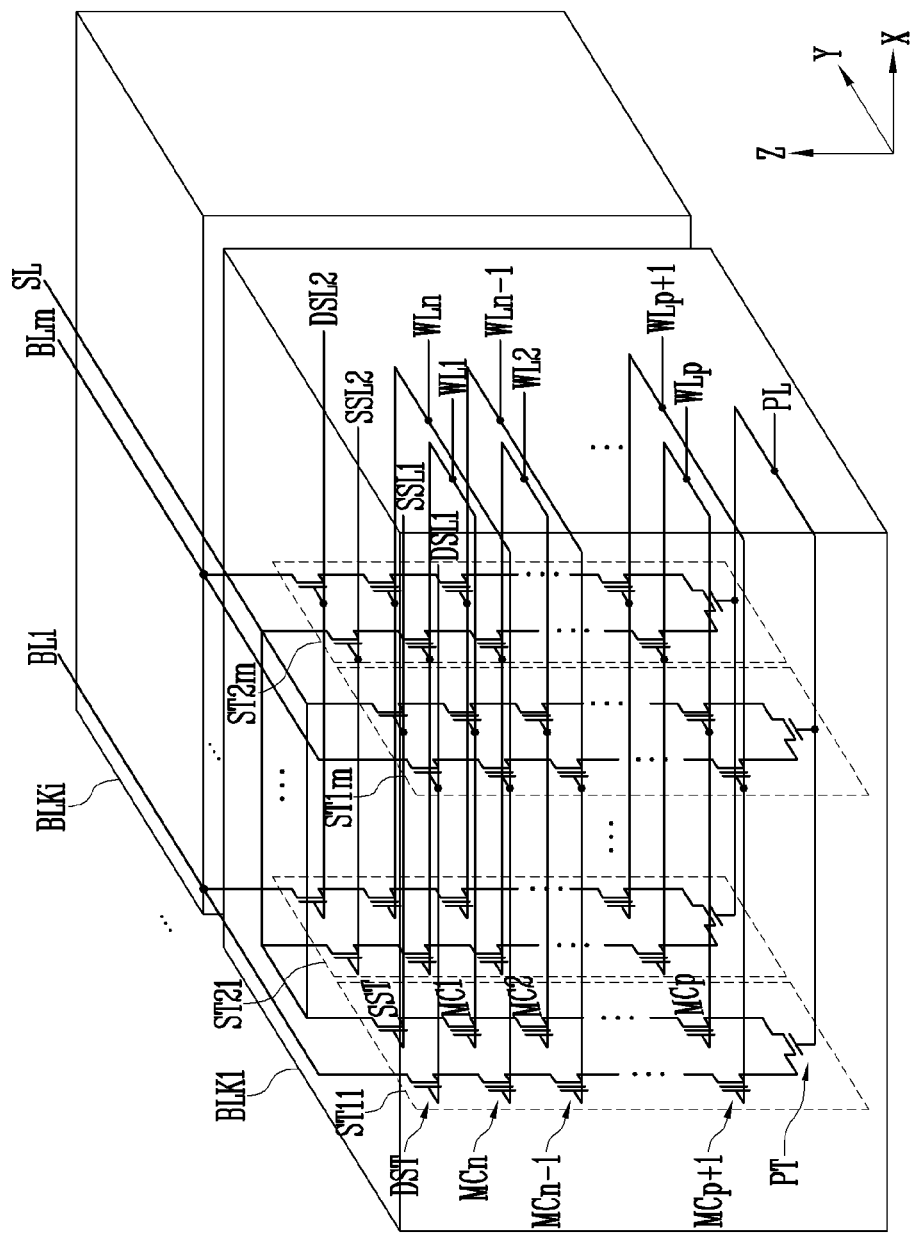
FIG. 17 is a diagram illustrating an example of a memory block having a 3D structure.

FIG. 17 is a diagram illustrating an example of a memory block having a 3D structure.

A memory cell array 2240 may include a plurality of memory blocks BLK1 to BLKi. When the first memory block BLK1 is described by way of example, the first memory block BLK1 may include a plurality of strings ST11 to ST1m and ST21 to ST2m. In an embodiment, each of the strings ST11 to ST1m and ST21 to ST2m may be formed in a 'U' shape. In the first memory block BLK1, m strings may be arranged in a row direction (e.g., X direction). Although, in FIG. 17, two strings are illustrated as being arranged in a column direction (e.g., Y direction), this embodiment is given for convenience of description, and three or more strings may be arranged in the column direction (e.g., Y direction) in other embodiments.

Each of the plurality of strings ST11 to ST1m and ST21 to ST2m may include at least one source select transistor SST, first to n-th memory cells MC1 to MCn, a pipe transistor PT, and at least one drain select transistor DST.

The source and drain select transistors SST and DST and the memory cells MC1 to MCn may have a similar structure. For example, each of the source and drain select transistors SST and DST and the memory cells MC1 to MCn may include a channel layer, a tunnel insulating layer, a charge trap layer, and a blocking insulating layer. For example, a pillar for providing the channel layer may be provided in each string. For example, a pillar for providing at least one of the channel layer, the tunnel insulating layer, the charge trap layer, and the blocking insulating layer may be provided in each string.

The source select transistor SST of each string may be coupled between a source line SL and memory cells MC1 to MCp.

In an embodiment, source select transistors of strings arranged in the same row may be coupled to a source select line extending in the row direction, and source select transistors of strings arranged in different rows may be coupled to different source select lines. In FIG. 17, the source select transistors of the strings ST11 to ST1m in a first row may be coupled to a first source select line SSL1. The source select transistors of the strings ST21 to ST2m in a second row may be coupled to a second source select line SSL2.

In other embodiments, the source select transistors of the strings ST11 to ST1m and ST21 to ST2m may be coupled in common to one source select line.

The first to n-th memory cells MC1 to MCn in each string may be coupled between the source select transistor SST and the drain select transistor DST.

The first to n-th memory cells MC1 to MCn may be divided into first to p-th memory cells MC1 to MCp and p+1-th to n-th memory cells MCp+1 to MCn. The first to p-th memory cells MC1 to MCp may be sequentially arranged in a vertical direction (e.g., Z direction), and may be coupled in series between the source select transistor SST and the pipe transistor PT. The p+1-th to n-th memory cells MCp+1 to MCn may be sequentially arranged in the vertical direction (e.g., Z direction), and may be coupled in series between the pipe transistor PT and the drain select transistor DST. The first to p-th memory cells MC1 to MCp and the p+1-th to n-th memory cells MCp+1 to MCn may be coupled to each other through the pipe transistor PT. Gates of the first to n-th memory cells MC1 to MCn in each string may be coupled to first to n-th word lines WL1 to WLn, respectively.

In an embodiment, at least one of the first to n-th memory cells MC1 to MCn may be used as a dummy memory cell. When the dummy memory cell is provided, the voltage or current of the corresponding string may be stably controlled. A gate of the pipe transistor PT of each string may be coupled to a pipeline PL.

The drain select transistor DST of each string may be coupled between the corresponding bit line and the memory cells MCp+1 to MCn. Strings arranged in the row direction may be coupled to the corresponding drain select line extending in the row direction. The drain select transistors of the strings ST11 to ST1m in the first row may be coupled to a drain select line DSL1. The drain select transistors of the strings ST21 to ST2m in the second row may be coupled to a second drain select line DSL2.

The strings arranged in the column direction may be coupled to bit lines extending in the column direction. In FIG. 17, the strings ST11 and ST21 in a first column may be coupled to a first bit line BL1. The strings ST1m and ST2m in an m-th column may be coupled to an m-th bit line BLm.

Among strings arranged in the row direction, memory cells coupled to the same word line may constitute one page. For example, memory cells coupled to the first word line WL1, among the strings ST11 to ST1m in the first row, may constitute one page. Among the strings ST21 to ST2m in the second row, memory cells coupled to the first word line WL1 may constitute one additional page. Strings arranged in the direction of one row may be selected by selecting any one of the drain select lines DSL1 and DSL2. One page may be selected from the selected strings by selecting any one of the word lines WL1 to WLn.

Figure 18:
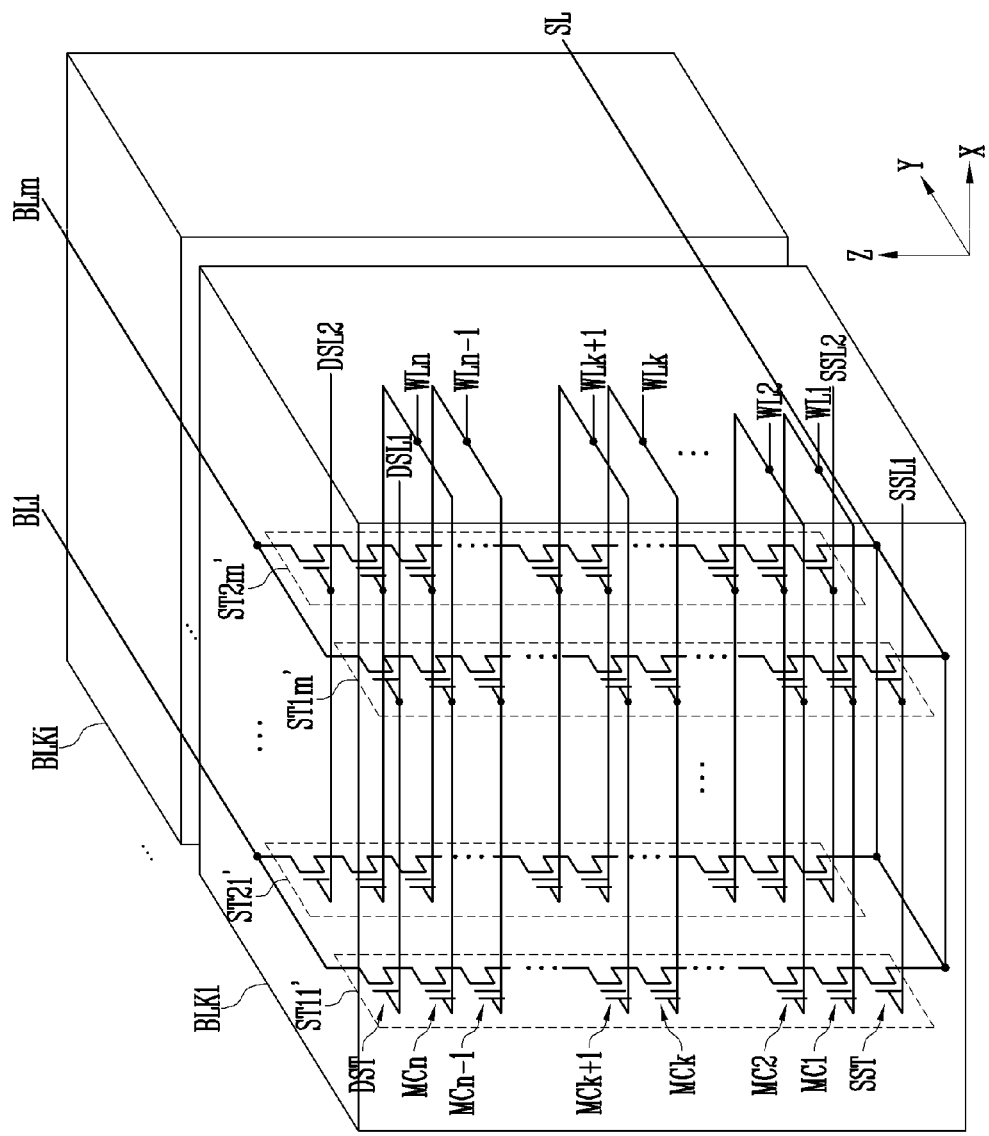
FIG. 18 is a diagram illustrating an example of a memory block having a 3D structure.

FIG. 18 is a diagram illustrating an example of a memory block having a 3D structure.

A memory cell array 2240 includes a plurality of memory blocks BLK1 to BLKi. When the first memory block BLK1 is described by way of example, the first memory block BLK1 may include a plurality of strings ST11' to ST1m' and ST21' to ST2m'. Each of the strings ST11' to ST1m' and ST21' to ST2m' may extend along a vertical direction (e.g., Z direction). In the memory block BLKi, m' strings may be arranged in a row direction (e.g., X direction). Although, in FIG. 18, two strings are illustrated as being arranged in a column direction (e.g., Y direction), this embodiment is given for convenience of description, and three or more strings may be arranged in the column direction (e.g., Y direction) in other embodiments.

Each of the strings ST11' to ST1m' and ST21' to ST2m' may include at least one source select transistor SST, first to n-th memory cells MC1 to MCn, and at least one drain select transistor DST.

The source select transistor SST of each string may be coupled between a source line SL and the memory cells MC1 to MCn. Source select transistors of strings arranged in the same row may be coupled to the same source select line. The source select transistors of the strings ST11' to ST1m' arranged in a first row may be coupled to a first source select line SSL1. The source select transistors of the strings ST21' to ST2m' arranged in a second row may be coupled to a second source select line SSL2. In an embodiment, the source select transistors of the strings ST11' to ST1m' and ST21' to ST2m' may be coupled in common to one source select line.

The first to n-th memory cells MC1 to MCn in each string may be coupled in series between the source select transistor SST and the drain select transistor DST. Gates of the first to n-th memory cells MC1 to MCn may be coupled to first to n-th word lines WL1 to WLn, respectively.

In an embodiment, at least one of the first to n-th memory cells MC1 to MCn may be used as a dummy memory cell. When the dummy memory cell is provided, the voltage or current of the corresponding string may be stably controlled. Thereby, the reliability of data stored in the first memory block BLK1 may be improved.

The drain select transistor DST of each string may be coupled between the corresponding bit line and the memory cells MC1 to MCn. The drain select transistors DST of strings arranged in the row direction may be coupled to a drain select line extending along the row direction. The drain select transistors DST of the strings ST11' to ST1m' in the first row may be coupled to a first drain select line DSL1. The drain select transistors DST of the strings ST21' to ST2m' in the second row may be coupled to a second drain select line DSL2.

That is, the first memory block BLK1 of FIG. 18 may have an equivalent circuit similar to that of the first memory block BLK1 of FIG. 17 except that a pipe transistor PT is excluded from each string.

Figure 19:
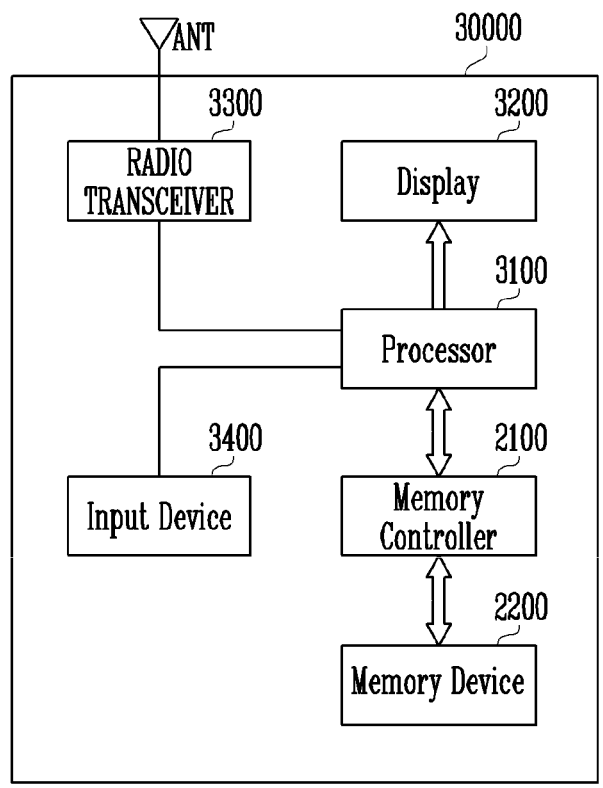
FIGS. 19 to 22 are diagrams illustrating examples of a memory system having the memory controller of FIG. 10.

FIG. 19 is a diagram illustrating an example of a memory system including the memory controller of FIG. 10.

Referring to FIG. 19, a memory system 30000 may be implemented as a cellular phone, a smartphone, a tablet, a personal computer (PC), a personal digital assistant (PDA) or a wireless communication device. The memory system 30000 may include a memory device 2200 and a memory controller 2100 that is capable of controlling the operation of the memory device 2200.

The memory controller 2100 may control a data access operation, e.g., a program, erase, or read operation, of the memory device 2200 under the control of a processor 3100.

Data programmed in the memory device 2200 may be output through a display 3200 under the control of the memory controller 2100.

A radio transceiver 3300 may send and receive radio signals through an antenna ANT. For example, the radio transceiver 3300 may change a radio signal received through the antenna ANT into a signal which may be processed by the processor 3100. Therefore, the processor 3100 may process a signal output from the radio transceiver 3300 and transmit the processed signal to the memory controller 2100 or the display 3200. The memory controller 2100 may transmit a signal processed by the processor 3100 to the memory device 2200. Furthermore, the radio transceiver 3300 may change a signal output from the processor 3100 into a radio signal, and output the changed radio signal to the external device through the antenna ANT. An input device 3400 may be used to input a control signal for controlling the operation of the processor 3100 or data to be processed by the processor 3100. The input device 3400 may be implemented as a pointing device such as a touch pad or a computer mouse, a keypad or a keyboard. The processor 3100 may control the operation of the display 3200 such that data output from the memory controller 2100, data output from the radio transceiver 3300, or data output from the input device 3400 is output through the display 3200.

In an embodiment, the memory controller 2100 capable of controlling the operation of the memory device 2200 may be implemented as a part of the processor 3100 or as a chip provided separately from the processor 3100.

Figure 20:
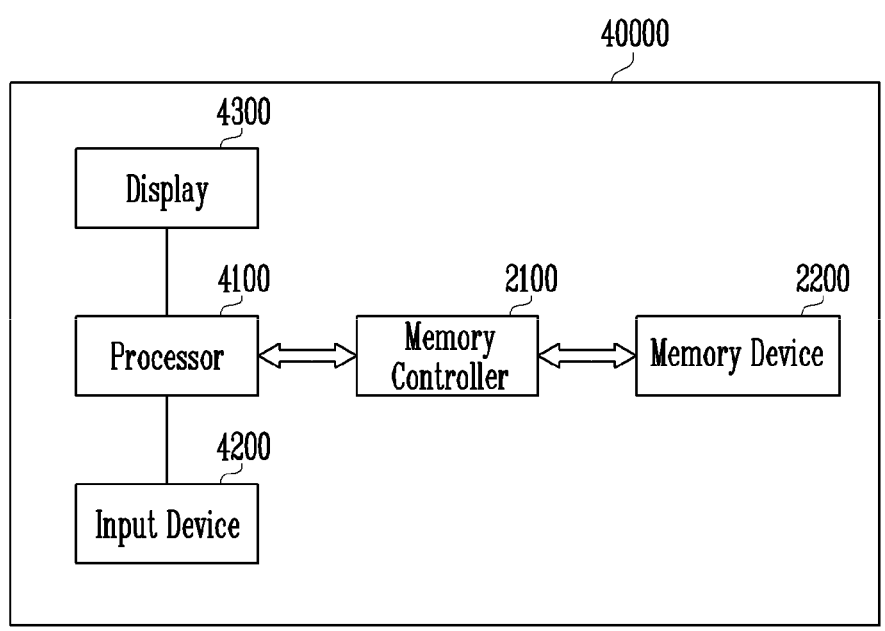

FIG. 20 is a diagram illustrating an example of a memory system including the memory controller of FIG. 10.

Referring to FIG. 20, a memory system 40000 may be embodied in a personal computer, a tablet, a net-book, an e-reader, a personal digital assistant (PDA), a portable multimedia player (PMP), an MP3 player, or an MP4 player.

The memory system 40000 may include a memory device 2200 and a memory controller 2100 that is capable of controlling the data processing operation of the memory device 2200.

A processor 4100 may output data stored in the memory device 2200 through a display 4300, according to data input from an input device 4200. For example, the input device 4200 may be implemented as a point device such as a touch pad or a computer mouse, a keypad or a keyboard.

The processor 4100 may control the overall operation of the memory system 40000 and control the operation of the memory controller 2100. In an embodiment, the memory controller 2100 capable of controlling the operation of the memory device 2200 may be implemented as a part of the processor 4100 or as a chip provided separately from the processor 4100.

Figure 21:
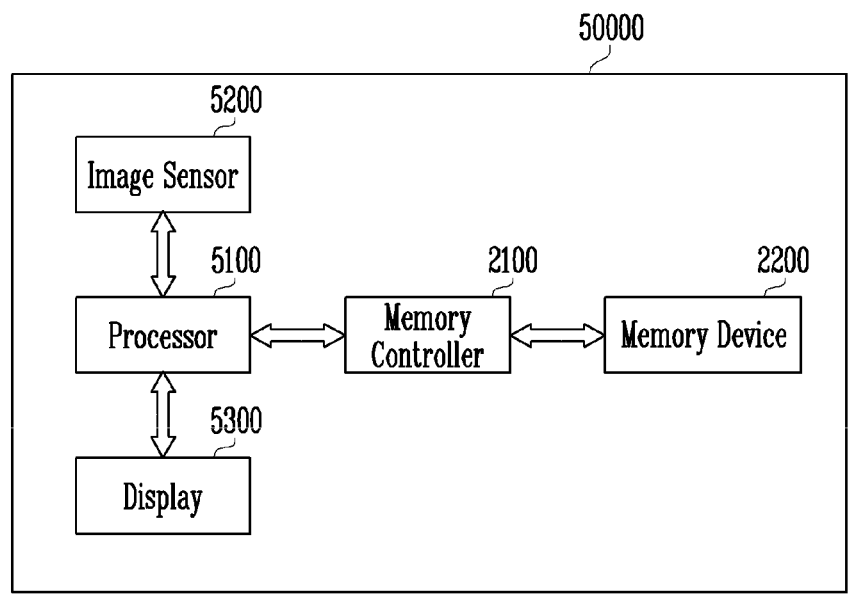

FIG. 21 is a diagram illustrating an example of a memory system including the memory controller of FIG. 10.

Referring to FIG. 21, a memory system 50000 may be embodied in an image processing device, e.g., a digital camera, a portable phone provided with a digital camera, a smartphone provided with a digital camera, or a tablet provided with a digital camera.

The memory system 50000 may include a memory device 2200 and a memory controller 2100 that is capable of controlling a data processing operation, e.g., a program, erase, or read operation, of the memory device 2200.

An image sensor 5200 of the memory system 50000 may convert an optical image into digital signals. The converted digital signals may be transmitted to a processor 5100 or the memory controller 2100. Under the control of the processor 5100, the converted digital signals may be output through a display 5300 or stored in the memory device 2200 through the memory controller 2100. Data stored in the memory device 2200 may be output through the display 5300 under the control of the processor 5100 or the memory controller 2100.

In an embodiment, the memory controller 2100 capable of controlling the operation of the memory device 2200 may be implemented as a part of the processor 5100, or as a chip provided separately from the processor 5100.

Figure 22:
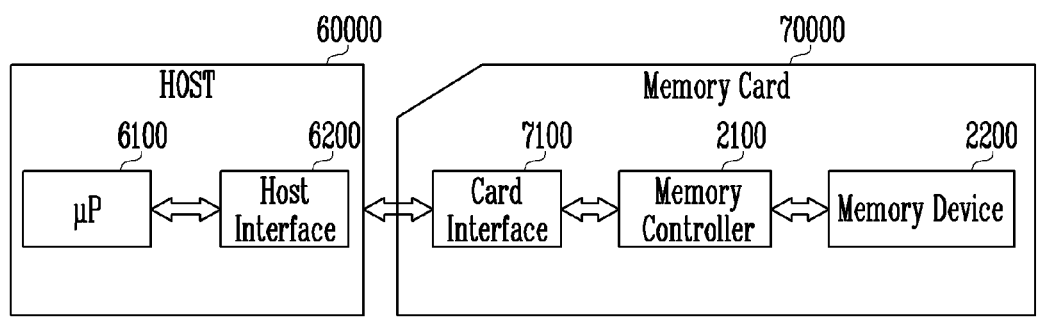

FIG. 22 is a diagram illustrating an example of a memory system including the memory controller of FIG. 10.

Referring to FIG. 22, a memory system 70000 may be embodied in a memory card or a smart card. The memory system 70000 may include a memory device 2200, a memory controller 2100, and a card interface 7100.

The memory controller 2100 may control data exchange between the memory device 2200 and the card interface 7100. In an embodiment, the card interface 7100 may be a secure digital (SD) card interface or a multi-media card (MMC) interface, but it is not limited thereto.

The card interface 7100 may interface data exchange between a host 60000 and the memory controller 2100 according to a protocol of the host 60000. In an embodiment, the card interface 7100 may support a universal serial bus (USB) protocol, and an interchip (IC)-USB protocol. Here, the card interface 7100 may refer to hardware capable of supporting a protocol which is used by the host 60000, software installed in the hardware, or a signal transmission method.

When the memory system 70000 is connected to a host interface 6200 of the host 60000 such as a PC, a tablet, a digital camera, a digital audio player, a cellular phone, console video game hardware or a digital set-top box, the host interface 6200 may perform data communication with the memory device 2200 through the card interface 7100 and the memory controller 2100 under the control of a microprocessor (μP) 6100.

Some embodiments of the disclosed technology provide a memory apparatus that uses a Bose, Chaudhri, Hocquenghem (BCH) code to encode data to be stored in pages of the memory apparatus. The memory apparatus may configure the pages such that each of the pages includes a message part, a first parity part, and a second parity part.

In some embodiments of the disclosed technology, the error correction ability of an error correction circuit that uses a BCH code may be varied.

In some the disclosed technology, system performance may be improved during error correction decoding without changing the design of a conventional memory system.

Some of the components of the disclosed devices or modules can be implemented as hardware, software, or combinations thereof. For example, a hardware implementation of electronic components can include discrete analog and/or digital components that are, for example, integrated as part of a printed circuit board. Alternatively, or additionally, the disclosed components or modules can be implemented as an Application Specific Integrated Circuit (ASIC) and/or as a Field Programmable Gate Array (FPGA) device. Some implementations may additionally or alternatively include a digital signal processor (DSP) that is a specialized microprocessor with an architecture optimized for the operational needs of digital signal processing associated with the disclosed functionalities of this application. Similarly, the various components or sub-components within each module may be implemented in software, hardware or firmware. The connectivity between the modules and/or components within the modules may be provided using any one of the connectivity methods and media that is known in the art, including, but not limited to, communications over the Internet, wired, or wireless networks using the appropriate.

While the exemplary embodiments of the disclosed technology have been disclosed for illustrative purposes, those skilled in the art will appreciate that various modifications, additions and substitutions are possible. Therefore, the scope of the disclosed technology must be defined by the appended claims and equivalents of the claims rather than by the description preceding them.

What is claimed is:

1. An error correction circuit in communication with a memory device, comprising:
    an encoder configured to generate a codeword comprising a message part, a first parity part, and a second parity part; and
    a decoder configured to receive read values corresponding to at least a portion of the codeword from the memory device and perform error correction decoding using the read values corresponding to the at least the portion of the codeword,
    wherein, the decoder is configured to perform error correction decoding based on a first or a second error correction ability such that error correction decoding using the first error correction ability is performed using partial read values corresponding to a partial codeword including the message part and the first parity part, and error correction decoding using the second error correction ability is performed using read values corresponding to the entire codeword, and
    wherein the second error correction ability is greater than the first error correction ability.

2. The error correction circuit according to claim 1, wherein the decoder is configured to, upon failure of successfully decoding using the first error correction ability as part of a first error correction decoding using the partial read values, perform a second error correction decoding using the read values corresponding to the entire codeword.

3. The error correction circuit according to claim 2, wherein the decoder is configured to perform the first error correction decoding using a parity check matrix identical to a parity check matrix used for the second error correction decoding.

4. The error correction circuit according to claim 3, wherein the decoder comprises:

a buffer configured to include extended partial read values having a number of bits identical to a number of columns of the parity check matrix by padding the partial read values with a predetermined number of symbols; wherein the decoder is configured to perform the first error correction decoding using the parity check matrix and the extended partial read values.

5. The error correction circuit according to claim 4, wherein the partial read values are padded with the symbols at a position corresponding to the second parity part.

6. The error correction circuit according to claim 4, wherein the padded symbols have either logic 1 value or logic 0 value and all of the padded symbols have the same logic value.

7. The error correction circuit according to claim 1, wherein:

the encoder generates the codeword using a generator matrix of a Bose, Chaudhri, Hocquenghem (BCH) code, and the decoder performs the error correction decoding using a parity check matrix of the BCH code.

8. A memory controller, comprising:

an encoder configured to generate a codeword including a message part, a first parity part, and a second parity part; and a central processing unit (CPU) configured to generate a command and an address and transmit the generated command and address to a memory device so that a partial codeword, consisting of the message part and the first parity part, and the second parity part are stored in different storage areas.

9. The memory controller according to claim 8, wherein the CPU manages a mapping relationship between a physical address at which the partial codeword is stored and a physical address at which the second parity part corresponding to the partial codeword is stored.

10. The memory controller according to claim 8, wherein each of the storage areas is a chunk, a page or a memory block.

11. The memory controller according to claim 8, wherein the CPU is configured to, whenever a single codeword is generated, transmit a command and an address for storing the generated single codeword to the memory device.

12. The memory controller according to claim 8, wherein the CPU is configured to:

upon generation of a single codeword, transmit a command and an address for storing a partial codeword of the generated single codeword to the memory device, and upon generation of a plurality of codewords and determination that a total length of a plurality of second parity parts corresponding to the plurality of codewords is equal to a length of a single storage area, transmit a command and an address for storing the plurality of second parity parts in the single storage area to the memory device.

13. The memory controller according to claim 8, wherein the memory controller further comprises:

a decoder configured to perform at least one of a first error correction decoding using partial read values corresponding to the partial codeword and a second error correction decoding using read values corresponding to the entire codeword.

14. The memory controller according to claim 13, wherein the decoder is configured to, upon a failure of the first error correction decoding, perform the second error correction decoding.

15. The memory controller according to claim 14, wherein the decoder is configured to perform the first error correction decoding using a parity check matrix identical to a parity check matrix used for the second error correction decoding.

16. The memory controller according to claim 15, wherein the decoder comprises:

a buffer configured to include extended partial read values having a number of bits identical to a number of columns of the parity check matrix by padding the partial read values with a predetermined number of symbols; wherein the decoder is configured to perform the first error correction decoding based on the parity check matrix and the extended partial read values.

17. The memory controller according to claim 16, wherein the partial read values are padded with the predetermined number of symbols at a position corresponding to the second parity part.

18. The memory controller according to claim 16, wherein the padded symbols have either logic 1 value or logic 0 value and all of the padded symbols have the same logic value.

19. The memory controller according to claim 13, wherein:

the encoder is configured to generate the codeword using a generator matrix of a Bose, Chaudhri, Hocquenghem (BCH) code, and the decoder is configured to perform the error correction decoding using a parity check matrix of the BCH code.

20. A memory system, comprising:

a memory controller configured to generate a codeword including a message part, a first parity part, and a second parity part; and a memory device configured to receive the codeword from the memory controller, store a partial codeword consisting of the message part and the first parity part of the received codeword in a first storage area and store the second parity part in a second storage area.

* * * * *